(12) United States Patent
Tenne et al.

(10) Patent No.: US 11,757,428 B2
(45) Date of Patent: Sep. 12, 2023

(54) ELECTROMECHANICAL RESONATORS BASED ON METAL-CHALCOGENIDE NANOTUBES

(71) Applicants: YEDA RESEARCH AND DEVELOPMENT CO. LTD., Rehovot (IL); B. G. NEGEV TECHNOLOGIES AND APPLICATIONS LTD., at Ben-Gurion University, Beer Sheva (IL)

(72) Inventors: Reshef Tenne, Rehovot (IL); Ernesto Joselevich, Rehovot (IL); Yiftach Divon, Rehovot (IL); Roi Levi, Rehovot (IL); Assaf Yaakobovitz, Rehovot (IL); Dan Yudilevich, Rehovot (IL)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 0 days.

(21) Appl. No.: 17/853,987

(22) Filed: Jun. 30, 2022

(65) Prior Publication Data
US 2022/0337222 A1 Oct. 20, 2022

Related U.S. Application Data

(63) Continuation of application No. 16/473,630, filed as application No. PCT/IL2017/051394 on Dec. 27, 2017, now Pat. No. 11,411,551.

(30) Foreign Application Priority Data

Dec. 27, 2016 (IL) .......................... 249804

(51) Int. Cl.
*H03B 5/30* (2006.01)
*H03H 9/24* (2006.01)
(Continued)

(52) U.S. Cl.
CPC .......... *H03H 9/2463* (2013.01); *B82B 1/002* (2013.01); *H03B 5/30* (2013.01); *H03H 9/02259* (2013.01);
(Continued)

(58) Field of Classification Search
CPC . B81B 2201/0271; B82B 1/002; C01G 41/00; H03B 5/30; H03H 3/007;
(Continued)

(56) References Cited

U.S. PATENT DOCUMENTS 6,159,742 A 12/2000 Lieber et al.
6,781,166 B2 8/2004 Lieber et al.
(Continued)

FOREIGN PATENT DOCUMENTS

CN 1865124 A 11/2006
CN 101143707 A 3/2008
(Continued)

OTHER PUBLICATIONS

Nagapriya et al. "Torsional Stick-Slip Behavior in WS2 Nanotubes" Physical Review Letters. Nov. 5, 2008;101(19); 195501(1)-195501(4).*
(Continued)

*Primary Examiner* — Levi Gannon
(74) *Attorney, Agent, or Firm* — Mark S. Cohen; PEARL COHEN ZEDEK LATZER BARATZ LLP

(57) ABSTRACT

This invention provides electromechanical resonators based on metal chalcogenide nanotubes. The invention further provides methods of fabrication of electromechanical reso-
(Continued)

nators and methods of use of such electromechanical resonators.

9 Claims, 14 Drawing Sheets

(51) Int. Cl.
    B82B 1/00    (2006.01)
    H03H 9/02    (2006.01)
(52) U.S. Cl.
    CPC ............... *B81B 2201/0271* (2013.01); *H03H 2009/02322* (2013.01)
(58) Field of Classification Search
    CPC .... H03H 9/02259; H03H 9/24; H03H 9/2463; H03H 2009/02322; Y10S 977/734
    See application file for complete search history.

(56) References Cited

U.S. PATENT DOCUMENTS

| | | | |
|---|---|---|---|
| 6,803,840 B2 | 10/2004 | Hunt et al. | |
| 6,841,142 B1* | 1/2005 | Tenne | C30B 29/605 850/16 |
| 6,874,668 B2* | 4/2005 | Cumings | C01B 21/0828 977/734 |
| 7,915,973 B2 | 3/2011 | Zettl et al. | |
| 8,120,448 B2* | 2/2012 | Peng | B82Y 10/00 977/932 |
| 8,518,364 B2* | 8/2013 | Tenne | B82Y 30/00 508/108 |
| 2002/0167374 A1* | 11/2002 | Hunt | B82Y 30/00 333/197 |
| 2004/0105808 A1* | 6/2004 | Tenne | B82Y 30/00 423/561.1 |
| 2009/0309676 A1* | 12/2009 | Zettl | G01N 29/036 333/186 |
| 2010/0144296 A1 | 6/2010 | Burke et al. | |
| 2010/0214034 A1 | 8/2010 | Peng et al. | |
| 2010/0239488 A1 | 9/2010 | Zettl et al. | |
| 2012/0329686 A1 | 12/2012 | Tenne et al. | |
| 2013/0109601 A1 | 5/2013 | Tenne et al. | |
| 2014/0203796 A1* | 7/2014 | Mohammadi | H01L 27/1203 257/632 |
| 2015/0023858 A1* | 1/2015 | Tour | B29C 39/003 423/276 |
| 2015/0253196 A1 | 9/2015 | Roukes | |

FOREIGN PATENT DOCUMENTS

| | | |
|---|---|---|
| JP | 2004-303678 A | 10/2004 |
| JP | 2005-056534 A | 3/2005 |
| JP | 2008-116668 A | 5/2008 |
| KR | 20030008057 A | 1/2003 |
| WO | WO 2002/080360 A1 | 10/2002 |
| WO | WO 2005/058758 A1 | 6/2005 |
| WO | WO 2005/067075 A1 | 7/2005 |
| WO | WO 2007/038180 A2 | 4/2007 |
| WO | WO 2008/049122 A2 | 4/2008 |
| WO | WO 2009/002588 A2 | 12/2008 |
| WO | WO 2009/034572 A1 | 3/2009 |
| WO | WO 2011/111044 A1 | 9/2011 |
| WO | WO 2014/021257 A1 | 6/2014 |

OTHER PUBLICATIONS

Levi et al. "Nanotube Electromechanics Beyond Carbon; The Case of WS2" Acs Nano. Dec. 22, 2015; 9(12); 12224-12232.*
Bao et al. "Squeeze film air damping in MEMS" Sensors and Actuators A: Physical. May 1, 2007;136(1):3-27.
Blom et al. "Dependence of the quality factor of micromachined silicon beam resonators on pressure and geometry" Journal of Vacuum Science & Technology B: Microelectronics and Nanometer Structures Processing, Measurement, and Phenomena. Jan. 1992;10(1):19-26.
Brontvein et al. "New high-temperature Pb-catalyzed synthesis of inorganic nanotubes" Journal of the American Chemical Society. Oct. 3, 2012;134(39):16379-86.
Cardinale et al. "Analysis of residual stress in cubic boron nitride thin films using micromachined cantilever beams" Diamond and related materials. Nov. 1, 1996;5(11):1295-302.
Chopra et al. "Measurement of the elastic modulus of a multi-wall boron nitride nanotube" University of California at Berkeley Berkeley United States; Jan. 1, 1998.
Cimalla et al. "Nanoelectromechanical devices for sensing applications" Sensors and Actuators B: Chemical. Sep. 20, 2007;126(1):24-34.
Cohen-Karni et al. "Torsional electromechanical quantum oscillations in carbon nanotubes" Nature nanotechnology. Oct. 2006;1(1):36-41.
Deepak et al. "Fullerene-Like (IF) NbxMo1-x S2 Nanoparticles" Journal of the American Chemical Society. Oct. 17, 2007;129(41):12549-62.
Divon et al. "Torsional resonators based on inorganic nanotubes" Nano letters. Jan. 11, 2017;17(1):28-35.
Enyashin et al. "Inorganic Fullerenes and Nanotubes" in Handbook of Nanophysics 4: Nanotubes and Nanowires ed KD Sattler (2010), ch. 12.
Garel et al. "Ultrahigh torsional stiffness and strength of boron nitride nanotubes" Nano letters. Dec. 12, 2012;12(12):6347-52.
Garel et al. "BCN nanotubes as highly sensitive torsional electromechanical transducers" Nano letters. Nov. 12, 2014;14(11):6132-7.
Hall et al. "Electromechanical response of single-walled carbon nanotubes to torsional strain in a self-contained device" Nature nanotechnology. Jul. 2007;2(7):413.
Hall et al. "A self-sensing nanomechanical resonator built on a single-walled carbon nanotube" Nano Letters. Nov. 12, 2008;8(11):3746-9.
Hall et al. "Torsional electromechanical systems based on carbon nanotubes" Reports on Progress in Physics. Oct. 16, 2012;75(11):116501.
Hierold et al. "Nano electromechanical sensors based on carbon nanotubes" Sensors and Actuators A: Physical. May 1, 2007;136(1):51-61.
Hosaka et al. "Damping characteristics of beam-shaped micro-oscillators" Sensors and Actuators A: Physical. Jun. 1, 1995;49(1-2):87-95.
International Search Report for PCT Application No. PCT/IL2017/051394 dated Mar. 9, 2018.
Joselevich E. "Twisting nanotubes: From torsion to chirality" Chemphyschem: a European journal of chemical physics and physical chemistry. Jul. 10, 2006;7(7):1405-7.
Kaplan-Ashiri et al. "Mechanical behavior of individual WS 2 nanotubes" Journal of materials research. Feb. 2004;19(2):454-9.
Lee et al. "Air damping of atomically thin MoS2 nanomechanical resonators" Applied Physics Letters. Jul. 14, 2014;105(2):023104.
Levi et al. "Field-effect transistors based on WS2 nanotubes with high current-carrying capacity" Nano letters. Aug. 14, 2013;13(8):3736-41.
Levi et al. "Nanotube electromechanics beyond carbon: the case of WS2" Acs Nano. Dec. 22, 2015;9(12):12224-32.
Nagapriya et al. "Origin of torsion-induced conductance oscillations in carbon nanotubes" Physical Review B. Oct. 21, 2008;78(16):165417.
Nagapriya et al. "Torsional stick-slip behavior in WS 2 nanotubes" Physical review letters. Nov. 5, 2008;101(19):195501.
Pan et al. "Squeeze film damping effect on the dynamic response of a MEMS torsion mirror" Journal of Micromechanics and Microengineering. Sep. 1998;8(3):200.
Papadakis et al. "Resonant oscillators with carbon-nanotube torsion springs" Physical review letters. Sep. 27, 2004;93(14):146101.
Seifert et al. "Stability of metal chalcogenide nanotubes" The Journal of Physical Chemistry B. Mar. 14, 2002;106(10):2497-501.
Seifert et al. "Structure and electronic properties of MoS 2 nanotubes" Physical Review Letters. Jul. 3, 2000;85(1):146.

(56) References Cited

OTHER PUBLICATIONS

Sengupta et al. "Performance limits of transition metal dichalcogenide (MX2) nanotube surround gate ballistic field effect transistors" Journal of Applied Physics. May 21, 2013;113(19):194502.
Tambe et al. "Friction model for the velocity dependence of nanoscale friction" Nanotechnology. Aug. 26, 2005;16(10):2309.
Tenne et al. "Polyhedral and cylindrical structures of tungsten disulphide" Nature. Dec. 1992;360(6403):444-6.
Tenne R. "Inorganic nanotubes and fullerene-like nanoparticles" Journal of materials research. Nov. 2006;21(11):2726-43.
Wang et al. "In situ TEM measurements of the mechanical properties and behavior of WS 2 nanotubes" Nano Research. Jul. 1, 2008;1(1):22.
Williams et al. "Torsional response and stiffening of individual multiwalled carbon nanotubes" Physical Review Letters. Nov. 27, 2002;89(25):255502.
Williams et al. "Fabrication of nanometer-scale mechanical devices incorporating individual multiwalled carbon nanotubes as torsional springs" Applied physics letters. Feb. 3, 2003;82(5):805-7.
Yadgarov et al. "Controlled Doping of MS2 (M=W, Mo) Nanotubes and Fullerene-like Nanoparticles" Angewandte Chemie International Edition. Jan. 27, 2012;51(5):1148-51.
Yakobson et al. "Mechanical properties of carbon nanotubes" in Carbon nanotubes 2001 (pp. 287-327). Springer, Berlin, Heidelberg.
Zhang et al. "Interwall friction and sliding behavior of centimeters long double-walled carbon nanotubes" Nano letters. Feb. 10, 2016;16(2):1367-74.
Zhi et al. "Specific heat capacity and density of multi-walled boron nitride nanotubes by chemical vapor deposition" Solid state communications. Jan. 1, 2011;151(2):183-6.

\* cited by examiner

| mode | Torsion | In-plane rotation | In-plane bending | Out-of-plane bending |
|---|---|---|---|---|
| simulation | | | | |
| measured resonance frequency (MHz) | 1.5 | - | 12.4 | 18.1 |
| hollow cylinder eigenfrequency (MHz) | 1.2 | 4.1 | 8.2 | 7.2 |
| solid rod eigenfrequency (MHz) | 3.1 | 9.7 | 13.9 | 18.9 |

Figure 3

| mode | | simulation | measured resonance frequency (MHz) | hollow cylinder eigenfrequency (MHz) | solid rod eigenfrequency (MHz) |
|---|---|---|---|---|---|
| Torsion | | | 5.8 | 2.8 | 9.8 |
| In-plane rotation | | | - | 9.8 | 32.2 |
| In-plane bending | | | - | 11.0 | 36.6 |
| Out-of-plane bending | | | - | 14.0 | 45.2 |

Figure 7

| mode | Torsion | Out-of-plane bending | In-plane bending | In-plane rotation |
|---|---|---|---|---|
| simulation | | | | |
| measured resonance frequency (MHz) | 15.2 | 23.3 | - | - |
| hollow cylinder eigenfrequency (MHz) | 2.2 | 12.3 | 8.9 | 8.2 |
| solid rod eigenfrequency (MHz) | 11.0 | 29.6 | 31.1 | 36.4 |

Figure 8

ELECTROMECHANICAL RESONATORS BASED ON METAL-CHALCOGENIDE NANOTUBES

CROSS-REFERENCE TO RELATE APPLICATIONS

This application is a Continuation Application of U.S. patent application Ser. No. 16/473,630 filed Jun. 26, 2019, which is a National Phase Application of PCT International Application No. PCT/IL2017/051394, International Filing Date Dec. 27, 2017, claiming priority of Israeli Application no. 249804, filed on Dec. 27, 2016, which are incorporated in their entirety herein by reference.

FIELD OF THE INVENTION

This invention relates to electromechanical resonators based on metal-chalcogenide nanotubes.

BACKGROUND OF THE INVENTION

Inorganic nanotubes (INT's), first reported in 1992 increasingly attract interest as the rolled-up version of non-carbon 2D materials, and as potential building blocks for nanotechnology. Carbon nanotubes (CNTs) have long been regarded as attractive building blocks for nano-electromechanical systems (NEMS) owing to their outstanding mechanical and electrical properties, as well as their unique electromechanical coupling. In particular, torsional electromechanical systems could be used as the basis for gyroscopes for navigation of ultra-miniaturized unmanned aerial vehicles (UAVs), and for various chemical and biological sensors. Extensive work has been done with respect to CNT-based torsional devices: fabrication, characterization of torsional and electromechanical properties in single-walled CNTs (SWCNTs) and multi-walled CNTs (MWCNTs), and creation of MWCNT and SWCNT torsional resonators. One of the most critical factors determining the sensitivity of resonant NEMS is their quality factor — a dimensionless parameter corresponding to the ratio between the stored and dissipated energy per cycle. Namely, the higher the quality factor, the less energy gets dissipated during one oscillation cycle. Internal friction, interlayer coupling, crystallographic structure and chemical composition can play a critical role in determining the torsional behavior of nanotubes, and specifically their quality factor (Q).

SUMMARY OF THE INVENTION

This invention presents for the first time, resonant electromechanical behavior of metal-chalcogenide nanotubes. The resonant torsional behaviors of metal-chalcogenide nanotubes, specifically tungsten disulfide ($WS_2$) is presented, and compared to that of carbon nanotubes. It was found that $WS_2$ nanotubes for example possess the highest quality factor (Q) and torsional resonance frequency, ever found in nanotubes. Dynamic and static torsional spring constants of the various nanotubes were found to be different, especially in the case of $WS_2$, possibly due to a velocity-dependent intershell friction. The results indicate that metal-chalcogenide nanotubes are promising building blocks for high-Q electromechanical resonator systems.

In one embodiment, this invention provides an electromechanical resonator comprising at least one metal-chalcogenide nanotube.

In one embodiment, the resonator is a microelectromechanical device, nanoelectromechanical device or a combination thereof.

In one embodiment, the metal chalcogenide nanotube comprises $WS_2$, $MoS_2$, $WSe_2$, $MoSe_2$. In one embodiment, the metal chalcogenide nanotube consists of $WS_2$, $MoS_2$, $WSe_2$, $MoSe_2$. In one embodiment, the metal chalcogenide nanotube comprises $Mo_{1-x}Nb_xS_2$, $Mo_{1-x}Nb_xSe_2$, $W_{1-x}Ta_xS_2$, $W_{1-x}Ta_xSe_2$, $Mo_xW_yNb_{1-x-y}S_2$, $Mo_xW_yNb_{1-x-y}Se_2$, $Re_{1-x}W_xS_2$, $Ti_{1-x}Sc_xS_2$, $Zr_{1-x}Y_xS_2$, $Hf_{1-x}La_xS_2$, $Ta_{1-x}Hf_xS_2$, $Pt_{1-x}Ir_xS_2$, $Ru_{1-x}Mn_xS_2$, $Rh_{1-x}Ru_xS_2$, $Mo_{1-x}Re_xS_2$, $W_{1-x}Re_xS_2$, $Re_{1-x}Os_xS_2$, $Ti_{1-x}V_xS_2$, $Zr_{1-x}Nb_xS_2$, $Hf_{1-x}Ta_xS_2$, $Ta_{1-x}W_xS_2$, $Pt_{1-x}Au_xS_2$, $Ru_{1-x}Rh_xS_2$, $Rh_{1-x}Pd_xS_2$, $WS_{2-x}Se_x$, $Mo_{1-x}W_xS_{2-y}Se_y$, $WS_{2-x-y}Se_xTe_y$, wherein $0.0001 < x < 0.5$ and $0.0001 < y < 0.5$ or wherein $0.0001 < x < 0.9999$ and $0.0001 < y < 0.9999$, or wherein $0.0001 < x < 0.5$ or wherein $0.0001 < x < 0.9999$ or wherein $0.0001 < x < 1.9999$ or wherein $0.0001 < x < 1.9999$ and $0.0001 < y < 1.9999$.

In one embodiment, the nanotube is doped by another material. In one embodiment, the nanotube is doped by a metal. In one embodiment, the metal is Nb or Re. In one embodiment, the material comprises hydrogen, oxygen, fluorine or sodium. In one embodiment, the electromechanical resonator is selected from the group consisting of: gyroscope, accelerometer, mass sensor, material sensor, magnetometer or moving mirror. In one embodiment, this invention provides a gyroscope, an accelerometer, a mass sensor, a material sensor, a magnetometer or a moving mirror comprising the electromechanical resonator of this invention. In one embodiment, the electromechanical resonator of this invention is a component in an apparatus selected from the group consisting of: a gyroscope, an accelerometer, a mass sensor, a material sensor, a magnetometer or moving mirror.

In one embodiment, the diameter of said nanotube ranges between 1 nm and 1000 nm. In one embodiment, the diameter of said nanotube ranges between 1 nm and 100 nm. In one embodiment, the diameter of said nanotube ranges between 1 nm and 10 nm or between 10 nm and 50 nm or between 50 nm and 250 nm or between 250 nm and 500 nm or between 500 nm and 1μm.

In one embodiment, for a single nanotube, said nanotube is single-walled or multi-walled nanotube. In one embodiment, for more than one nanotube, the nanotubes are single-walled, multi-walled or a combination thereof.

In one embodiment, the nanotube is at least partially hollow. In one embodiment, the nanotube is not hollow. In one embodiment, at least a portion of said nanotube is suspended over a surface, (a surface of a substrate in one embodiment).

In one embodiment, resonators of this invention further comprise:
a substrate;
at least a first pad and a second pad;
electrical contacts.

In one embodiment, a first region of said nanotube is in contact with the first pad and a second region of the nanotube is in contact with the second pad.

In one embodiment, each of the first pad and the second pad is in contact with the substrate. In one embodiment, the substrate is coated. In one embodiment, the substrate comprises Si and the coating comprise $SiO_2$.

In one embodiment, the resonator further comprises a pedal. In one embodiment, the pedal is in contact with the nanotube. In one embodiment, the pedal is of a rectangular shape and is attached to said nanotube such that the longer dimension of said rectangle is positioned perpendicular to the longer dimension of said nanotube. In one embodiment, the rectangular pedal is positioned asymmetrically with respect to said nanotube.

In one embodiment, the nanotube is suspended over the substrate. In one embodiment, the pedal is suspended over the substrate. In one embodiment, the resonator is connected to electronic components/electronic instrument(s).

In one embodiment, the instrument(s) comprise network analyzer, oscilloscope, lock-in amplifier, spectrum analyzer, RF signal generator, power supply, AC power generator, DC power generator, signal generator, pulse generator, function generator, waveform generator, digital pattern generator, frequency generator or a combination thereof.

In one embodiment, the pads and the substrate independently are connected by said electrical contacts to any one or more of said instrument(s), and said instrument(s) applies voltage between the pads and between the substrate through the electrical contacts.

In one embodiment, the pads and the substrate independently are connected by the electrical contacts to the network analyzer (or to any other instrument from the list provided herein above), and the network analyzer (or any other electronic instrument) applies voltage between the pads and between the substrate, through the electrical contacts. In one embodiment, an electrode is constructed on the substrate, the electrode is connected by electrical contacts to the network analyzer or to any other electronic instrument. According to this aspect and in one embodiment, voltage is applied between the pads and between the electrode, through the electrical contacts.

In one embodiment, the applied voltage generates mechanical response in the nanotube. In one embodiment, the Q factor of the resonator ranges between 1 and 1000000. In one embodiment, the Q factor of the resonator ranges between 1 and 100. In one embodiment, the Q factor of the resonator ranges between 100 and 1000. In one embodiment, the Q factor of the resonator ranges between 1000 and 1000000. In one embodiment, the Q factor of the resonator ranges between 1 and 5.

In one embodiment, the resonator further comprising an electrode fabricated on the substrate. In one embodiment, the electrode is connected by electrical contacts to an electronic instrument.

In one embodiment, this invention provides a method of fabrication of an electromechanical device, the method comprising:
  providing a substrate;
  applying at least a first pad and a second pad onto the substrate such that the pads are not in contact with each other;
  applying at least one metal-chalcogenide nanotube onto the pads such that a first region of the nanotube is in contact with the first pad and a second region of the nanotube is in contact with the second pad;
  removing a substrate surface layer underneath the nanotube, thus suspending the nanotube over the substrate.

In one embodiment, the substrate comprises Si coated by $SiO_2$. In one embodiment, the pads comprising chromium layer coated by gold layer.

In one embodiment, the step of applying the pads comprises photolithography and metal deposition. In one embodiment, the step of applying at least one metal-chalcogenide nanotube, comprises dry dispersion of the nanotube. In one embodiment, the step of removing a substrate surface-layer underneath the nanotube comprises etching the substrate layer using hydrofluoric acid (HF). In one embodiment, etching is followed by critical point drying (CPD). Other methods of applying the pads and the nanotubes and other methods of etching a surface layer are known in the art and are included in this invention.

In one embodiment, the method further comprises applying a pedal on top of said nanotube, prior to said step of removing a substrate surface layer, such that said pedal is in contact with said nanotube. In one embodiment, the pedal is of a rectangular shape and is attached to said nanotube such that the longer dimension of said rectangle is positioned perpendicular to the longer dimension of said nanotube. In one embodiment, the rectangular pedal is positioned asymmetrically with respect to said nanotube. In one embodiment, following said step of removing a substrate surface layer, the pedal is suspended over said substrate.

In one embodiment, the method further comprises fabricating an electrode on the substrate.

In one embodiment, this invention provides a method of operating an electrochemical resonator, the method comprising:
  providing a resonator comprising:
    at least one metal chalcogenide nanotube;
    a substrate;
    optionally an electrode fabricated on the substrate;
    at least a first pad and a second pad assembled on the substrate;
    electrical contacts connected to the first and second pads, optionally to the substrate and/or optionally to the electrode;
  wherein a first region of said metal-chalcogenide nanotube is in contact with the first pad and a second region of the nanotube is in contact with the second pad, and wherein a third region of the nanotube is suspended over the substrate;
  applying voltage between the pads and the substrate or between the pads and the electrode, such that the voltage generates mechanical response of the metal chalcogenide nanotube.

In one embodiment, the substrate is coated. In one embodiment, the coated substrate comprises silicon and the coating comprising silicon oxide.

In one embodiment, the mechanical response comprises torsion, in-plane rotation, in-plane bending, out of phase bending or a combination thereof.

In one embodiment, the electromechanical device/resonator is used as a gyroscope for navigation of miniaturized unmanned aerial vehicles (UAVs), as a material sensor such as a chemical sensor, or a biological sensor. In one embodiment, the device further comprises a pedal, said pedal is in contact with the suspended nanotube, such that the pedal is suspended over the substrate.

In one embodiment, the pedal is of a rectangular shape and is attached to the nanotube such that the longer dimension of the rectangle is positioned perpendicular to the longer dimension of the nanotube. In one embodiment, the rectangular pad is positioned asymmetrically with respect to the nanotube. In one embodiment, applying voltage comprising applying AC voltage, or a combination of AC and DC voltages. In one embodiment, the frequency of said AC voltage is in the RF range.

In one embodiment, the method of operating the device further comprising detecting the mechanical response of the nanotube. In one embodiment, the response is detected optically. In one embodiment, the response is detected electrically. In one embodiment, electrical detection comprises a conductivity measurement. In one embodiment, electrical detection comprises a capacitance measurement.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3 is comparison between the measured and simulated resonance frequencies of the different normal modes for a carbon nanotube-based torsional resonator (device 2, FIG. 2a). The two extreme intershell coupling cases of solid rod and hollow cylinder were examined. The underlined simulated frequencies are the ones closer to the measured ones.

FIG. 7 is FEA simulation of BNNT-based torsional device #1.

FIG. 8 is FEA simulation of $WS_2$ NT-based torsional device #1

Figure 1:
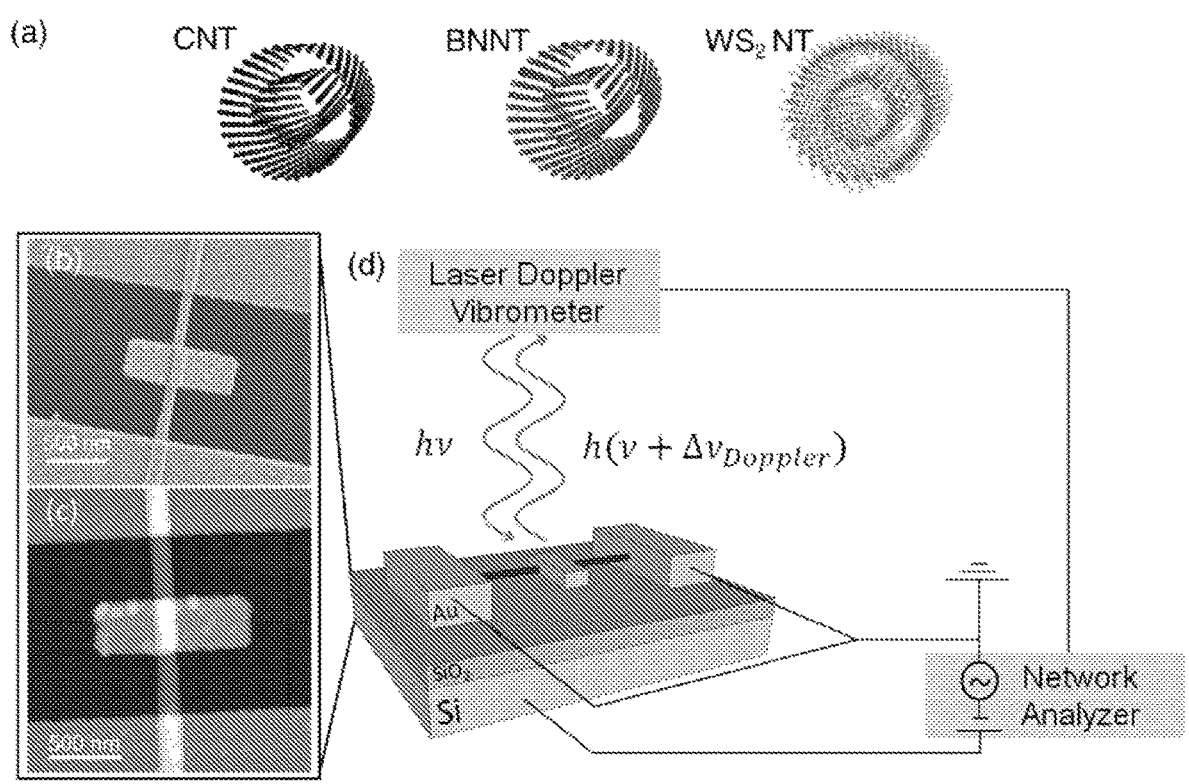
FIG. 1 shows the set up for a resonance spectrum measurement of nanotube-based torsional resonators (schematic setup). (a) schematic structure of multiwalled CNTs, BNNTs and $WS_2$ NTs; (b) scanning electron microscope (SEM) image; and (c) atomic force microscope (AFM) images of a nanotube-based torsional resonator. (d) torsional resonator is actuated by applying a DC and AC voltage between the substrate and the offset pedal, which is attached to the nanotube. The amplitude is detected by a laser Doppler vibrometer (LDV) and outputted to the network analyzer.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

As mentioned above, one of the most critical factors determining the sensitivity of resonant NEMS is their quality factor. The higher the quality factor, the less energy gets dissipated during one oscillation cycle. Internal friction, interlayer coupling, crystallographic structure and chemical composition can play a critical role in determining the torsional behavior of nanotubes, and specifically their quality factor (Q).

These aspects influencing the quality factor have motivated the examination of metal chalcogenide nanotubes as potential building blocks for torsional devices. To this end, $WS_2$ nanotubes ($WS_2$ NTs) were found to be a promising material owing to their significant electromechanical response, stick-slip torsional behavior, and high current-carrying capacity.

In one embodiment, this invention provides torsional resonators based on metal chalcogenide nanotubes. The electromechanical properties of the resonators are compared with CNT-based torsional resonators, in ambient conditions and in vacuum. It was found that metal chalcogenide nanotubes exhibit higher torsional resonance frequencies and quality factors, extending the available material toolbox for torsional NEMS devices. This invention further demonstrates that metal chalcogenide nanotubes are promising building blocks for NEMS in general and torsional NEMS in particular.

In one embodiment, the torsional resonators disclosed in this invention exhibit an intentional broken symmetry that enables their electrostatic actuation.

An embodiment of a torsional resonator (FIG. 1) consists of a suspended nanotube (MWCNT, $WS_2$NT) clamped between metallic pads at its ends, with a suspended pedal attached to its top. The pedal is off-centered with respect to the nanotube, so that each end of the pedal stands at a different distance from the nanotube (Figures 1b, 1c, the right-hand side of the pedal is longer than the left-hand side of the pedal with respect to the nanotube; and in Figure 1d, the far side of the pedal is shorter than the near side with respect to the nanotube line). The resonators were fabricated using electron-beam lithography, followed by wet etching and critical point drying (see Examples). In order to measure the oscillatory behavior of the torsional resonators, a DC bias voltage and a smaller AC drive voltage were applied between the substrate and the pedal using a network analyzer. The frequency of the AC component was swept from 0.1 to 24 MHz (the upper limit of the detection system according to this embodiment). The alternating voltage between the substrate and the pedal combined with the offset of the center of the pedal with respect to the nanotube created an oscillatory net torque on the pedal, thus periodically twisting the nanotube. The amplitude of the pedal was detected using a laser Doppler vibrometer (LDV), and is presented as a function of the drive AC voltage frequency, in order to capture the resonant response of each nanotube-based resonator (FIG. 1d).

In summary, for the first time the resonance spectrum of torsional NEMS based on metal chalcogenide nanotubes, namely $WS_2$ NTs and BNNTs, was measured and compared to that of similar devices based on MWCNTs. It was found that under atmospheric pressure $WS_2$ NTs exhibit the highest quality factor and resonance frequency, followed by BNNTs and MWCNTs. Without being bound to any theory, these results can be attributed to three main differences between the carbon, BN and $WS_2$ NTs: (i) diameter (which strongly affects the torsional spring constant), (ii) shear modulus (which linearly affects the spring constant), and (iii) the intershell coupling, which affects the effective number of layers contributing to the overall torsional behavior. The quality factor has a systematic dependence on the torsional spring constant in air, which is expected to change significantly in higher vacuum, where the intrinsic material properties dominate.

It was found that for INT when compared to CNT has higher coupling between the layers. The higher inter-layer coupling increases their stiffness, and this increases the resonant frequency. The higher inter-layer coupling also reduces the energy dissipation, and this increases the quality factor. The electrical response to torsion/twist (i.e. the change in electrical conductance as a result of being twisted) of $WS_2$ NTs is higher than that of CNTs. Having a higher resonant frequency, a higher quality factor and a higher electrical response to torsion all bring to an increase of the sensitivity of a torsional resonator to inertial changes. Therefore, resonators provided by this invention, based on INT's, are advantageous when compared with resonators based on CNT's.

Dynamic torsional spring constants were extracted from the torsional resonance peaks and compared to the static spring constants measured by AFM. It was found that while for CNTs and BNNTs the dynamic torsional spring constant is slightly higher than the static one, the dynamic K of $WS_2$ NTs is significantly larger than its static one. This difference between the constants might stem from a velocity-dependent intershell friction, though further study is needed in order to fully understand this interesting behavior. The resonance spectra of the various NTs were measured under vacuum conditions as well. It is believed that despite observing an expected increase in the quality factors of all NTs due to reduction of air damping, a sufficient vacuum level to enable observing the true intrinsic behavior of the NTs has not yet been reached. Future experiments at higher vacuum will provide more accurate values for the torsional mechanical properties of metal chalcogenide nanotubes. Nevertheless, the available data provide a significant estimation of their unique torsional resonant characteristics, showing that metal chalcogenide nanotubes have higher resonance frequencies and quality factors than carbon nanotubes, thus demonstrating the high potential of metal chalcogenide nanotubes to serve as building blocks for functional NEMS devices. The electromechanical coupling during the torsional motion of $WS_2$ NTs and BCNNTs (BCNNT=boron carbon nitride nanotube) could in principle enable electrical detection of the torsional motion, further contributing to the potential of metal chalcogenide nanotubes as building blocks for NEMS.

It is noted that in some embodiments, the device comprises a pedal and in other embodiments, the device does not comprise a pedal. In devices that comprise a pedal, the pedal is not just for analysis of electromechanical offset, but is part of the device in some embodiments. The pedal provides mass which has an inertial behavior and modulates the resonant frequency. In embodiments where the device does not comprise a pedal, other resonant electromechanical functions are enabled. For example, devices that are based on the vibrations of the nanotube as a string are encompassed by embodiments of the present invention. According to this aspect and in one embodiment, the nanotube portion suspended over a substrate, in between two anchors or pads, does not comprise any additional structure attached to the nanotube. In one embodiment, this invention provides a resonator comprising an inorganic nanotube. In one embodiment, this invention provides an electromechanical resonator comprising an inorganic nanotube. In one embodiment, this invention provides a resonator comprising an inorganic nanotube, wherein the resonator is activated electrically. In one embodiment, electrical activation of devices of this invention generates a mechanical response. In one embodiment, electrical activation of devices of this invention generates resonance response. In one embodiment, electrical activation at a certain resonance frequency, causes the nanotube to rotate or vibrate. In one embodiment, electrical activation at a certain resonance frequency, causes the nanotube to rotate or vibrate such that the rotation/vibration can be detected. In one embodiment, electrical activation at a certain resonance frequency, causes the nanotube to rotate or vibrate such that the rotation/vibration is used for further activation of other devices/systems. In one embodiment, movement of the nanotube in devices of this invention causes an electrical response. In one embodiment, the electrical response is detected or recorded. In one embodiment, the electrical response is used to activate other devices/systems. The devices described herein above are further characterized as described herein below.

The term "nanostructure" is meant to encompass any three-dimensional structure having at least one dimension in the nanometer range (i.e. between 0.1 and 100 nm or between 0.1 nm and 500 nm or between 0.1 nm and 999 nm according to certain embodiments). According to the present invention a nanostructure in the form of a nanotube comprises rolled-up sheet(s) of at least one metal-chalcogenide compound of a general formula MpXq, wherein M is a metal and X is a chalcogenide atom (ion), and p and q are any number between 0 and 3. In one embodiment, p, q or a combination thereof are integers. In one embodiment, a nanotube (NT) is a nanostructure as described herein above, in the form of a tube.

According to other embodiments, a nanostructure in the form of a nanotube comprises rolled-up sheet(s) of at least one metal-chalcogenide compound of a general formula $M_1p_1M_2p_2X_1q_1X_2q_2$, wherein $M_1$ is a first metal, $M_2$ is a second metal, $X_1$ is a first chalcogenide and $X_2$ is a second chalcogenide atom (ion), and p and q are between 0 and 3. In one embodiment, p1, p2, q1, q2, or a combination thereof are integers. In some embodiments, p1, p2, q1, q2, or a combination thereof are not integers. In one embodiment, pl is zero and p2, q1 and q2 are not zero. In one embodiment, q1 is zero and p1, p2 and q2 are not zero. In one embodiment, the metal-chalcogenide compound comprises one metal and one chalcogenide. In one embodiment, the metal-chalcogenide compound comprises two metals and one chalcogenide. In one embodiment, the metal-chalcogenide compound comprises one metal and two chalcogenides. In one embodiment, the metal-chalcogenide compound comprises two metals and two chalcogenides.

The description above is an example for the possible metal chalcogenides from which nanotubes of this invention are made. It is noted that any metal-chalcogenide composition is included in nanotubes of this invention, including a metal chalcogenide comprising one type of metal only (e.g. W only) and only one type of chalcogenide (e.g. S only), a metal chalcogenide comprising more than one metal and only one chalcogenide, a metal chalcogenide comprising one metal only and more than one chalcogenide, a metal chalcogenide comprising more than one metal and more than one chalcogenide. Combinations of nanotubes as described herein above can be used in devices where more than one nanotube is used. In a specific embodiment, the nanotube is of the formula MXn wherein M is a metal, X is a chalcogenide and n ranges between 0 and 3. In another specific embodiment, the nanotube is of the formula MXn wherein M is a metal, X is a chalcogenide and n is an integer with a value of 1, 2 or 3.

In some embodiments, the nanostructure is selected from a nanotube, a nanoscroll, a nanocage, or any combination thereof.

The term metal-chalcogenide nanotube is meant to encompass nanotubes comprising metal-chalcogenide compounds (which do not consist of carbon atoms in some embodiments). The nanotubes are formed from two-dimensional sheet(s) (i.e. sheet of a metal-chalcogenide compound) the sheets are rolled up to form a tube. The atoms within the sheet are held by strong chemical bonds.

In one embodiment, inorganic nanotubes (INT's) refer to nanotubes that do not comprise carbon. In one embodiment, the term 'inorganic nanotube' excludes carbon nanotubes. In one embodiment, inorganic nanotubes consist of inorganic elements only, excluding carbon.

Nanotubes of this invention can be single-walled in one embodiment. In some embodiments, nanotubes of this invention are multi-walled nanotubes. In some devices of this invention, single-wall nanotubes and multi-walled nanotubes are both present. In some embodiments, the nanotube is a single-walled closed tube comprising one layer of material. In one embodiment, multiwalled nanotube comprises more than one closed hollow tube, wherein the smaller diameter tubes(s) are positioned within the larger diameter tube(s). In other embodiment, the tube is a helical tube. In one embodiment, the tube is a spiral tube.

In some embodiments, devices of this invention are resonators. In some embodiments, electromechanical devices of this invention are resonators.

In metal chalcogenides of this invention of the formula $MX_n$ as described herein above, in some embodiments, M is any metal. In some embodiments, Metal M can be alkali metal, alkaline earth metal, transition metal or semi-metal.

In some embodiments, the metal M is selected from Li, Y, La, Ce, Pr, Nd, Pm, Sm, Eu, Gd, Tb, Dy, Ho, Er, Tm, Yb, and Lu, Ca, Sr, Ba, Sn, Pb, Sb, Bi, rare earths, Ti, V, Cr, Mn, Fe, Co, Ni, Nb, Ta, W, and Mo. Re, Zr, Hf, Pt, Ru, Rh, In, Ga, and alloys like WMo, TiW, $W_zMo_{1-z}$. In some embodiments, these metals are present in the metal chalcogenides of this invention of the formula $M_1p_1M_2p_2X_1q_1X_2q_2$ as described herein above.

Chalcogenide (X) or $(X_1)/(X_2)$, is selected from S, Se, Te, in some embodiments.

In some embodiments, the diameter of the nanotube ranges between 1 nm and 999 nm or between 1 nm and 990 nm or between 1 nm and 900 nm. In some embodiments, the diameter of the nanotube ranges between 10 nm and 999 nm or between 10 nm and 990 nm or between 10 nm and 900 nm. In some embodiments, the diameter of the nanotube ranges between 20 and 600 nm, between 20 nm and 500 nm, between 20 and 400 nm, between 20 nm and 350 nm, between 20 and 300 nm, between 20 and 250 nm, between 20 and 200 nm, between 20 and 150 nm, or even between 20 and 100 nm. In some embodiments, the diameter of the tubular nanostructure is between about 25 and about 500 nm, between about 50 and about 500 nm, between about 100 and about 500 nm, between about 150 and about 500 nm, between about 200 and about 500 nm, between about 250 and about 500 nm, or even between about 300 and about 500 nm. In an additional embodiment, the diameter of the tubular nanostructure is between about 25 and about 400 nm, between about 50 and about 350 nm, or between about 100 and about 250 nm.

Nanoscroll is a wire-shaped structure, wherein the layer of metal-chalcogenide material is scrolled and wherein the diameter of the wire-shaped scroll is within the nanometer range. In some embodiments, the nano-scroll comprises no hollow center. In other embodiments, the nanoscroll comprises a hollow center. In embodiments of this invention, where reference is made to a nanotube, the same embodiment is applicable to a nanoscroll.

In multiwalled nanotube that comprises layers of 2-D rolled up material, the number of layers ranges between 2-10 in one embodiment, or between 2-20 in some embodiments.

For nanotubes comprising layers that are each formed into a closed tube, the cross section of the nanotube exhibit 2-10 or 2-20 concentric circles one inside of the other.

In (multiwalled) nanoscrolls as described herein above, the number of layers can be counted from the inner layer or from the center of the cross-section of the scroll, going outwardly to the outermost layer.

In some embodiments, nanotubes or nanoscrolls of this invention are coated. In one embodiment, the coating layer comprises inorganic material. In one embodiment, the coating layer comprises organic material.

In some embodiments, electromechanical devices/resonators of this invention are combined with optical actuating/sensing. In some embodiments, electromechanical devices of this invention are combined with magnetic actuating/sensing. In some embodiments, electromechanical devices of this invention are combined with electrical actuating/sensing. In one embodiment, electromechanical devices of this invention are used as sensors for sensing the presence of chemical/biological materials. In one embodiment, the material sensed is water. In one embodiment, sensors/detectors based on devices of this invention comprise humidity sensors (water sensor), material detectors, chemical sensors/detectors, biological sensor/detectors, density detectors, geological detectors. In one embodiment, electromechanical devices of this invention are used as sensors for evaluating the dynamics of reactions of chemical/biological materials.

In one embodiment, the spacing (distance) between the pads in device of this invention ranges between 10 nm and 100 nm, or between 10 nm and 200 nm, or between 10 nm and 10 µm, or between 10 nm and 500 nm, or between 100 nm and 1000 nm, or between 1 µm and 10 µm, or between 1 µm and 5 µm or between 10 nm and 10 µm or between 10 nm and 100 µm.

In one embodiment, the length of nanotubes of this invention ranges between 100 nm and 100 µm, or between 10 nm and 100 nm, or between 1 µm and 10 µm, or between 1 µm and 100 µm, or between 100 nm and 1000 nm. In one embodiment, the length of the nanotube ranges between 20 nm and 100 nm or between 20 nm and 1000 nm or between 10 nm and 200 μm.

A Chalcogenide is a chemical compound consisting of at least one chalcogen anion and at least one cation. The chalcogenide anion is formed from an atom from group 16 of the periodic table. Metal chalcogenides are compounds comprising metal cation(s) and chalcogenide anion(s). In some embodiments, the term "chalcogenide" refers to the anion only while in other embodiments the term "chalcogenide" refers to the compound comprising the chalcogenide anion and a metal cation.

In some embodiments, the production of devices of this invention involves one or more of the following methods: deposition from solution (e.g. elecrtrodeposition or electroless deposition, saturation, centrifugation), vapor phase deposition/evaporation methods such as PVD, CVD, e-beam evaporation or resistive heating evaporation. In some embodiments, methods used to form portions of devices of this invention include methods utilizing a movable tip and a surface such as STM, AFM or methods related to STM and AFM devices and systems. In one embodiment, structures of this invention utilize self-assembly of atoms/molecules from solution or from a vapor phase onto a surface. In one embodiment, e-beam lithography involving various exposure parameters is used to form structures in devices of this invention. In one embodiment, methods involving stamping, molding, soft lithography, UV and e-beam lithography and related methods are used to pattern/form structures and components in devices of this invention. Methods involving wet etching, dry etching, resist application and lift-off, spin-coating, drop casting and relevant methods can be used to pattern/form components and structures in devices of this invention. Combinations of techniques from the techniques described above may be useful to construct devices of this invention. Any other method can be used to form structures of this invention as known to the skilled artisan.

Doping

In one embodiment, the nanotubes/nanoscrolls are doped. In one embodiment, the dopant material is non-metal. According to this aspect and in one embodiment the dopant in the nanotube/nanoscroll is hydrogen, oxygen, fluorine or sodium. Any other element in the form of neutral atom or ion can be used as a dopant in embodiments of the invention.

In another embodiment, the dopant is metal. According to this aspect and in one embodiment, the general structural formula of a doped metal-chalcogenide nanotube is $A_{(1-x)}$-$B_x$-$B_x$-chalcogenides. Atom (ion) B is incorporated into the lattice of the A-chalcogenide altering its characteristics as a function of the nature of A and B, and the amount of incorporated B, i.e. the value of x in the A-B-chalcogenide lattice. In some embodiments, the incorporation of $B_x$ into the lattice of the A-chalcogenide produces changes in the electronic properties leading to the formation of high conductivity semiconductors or even to metal and metal-like nanotubes obtained from a previously known semiconductor (i.e. the selected A-chalcogenide).

Thus, in some embodiments, the nanotubes/nanoscrolls of this invention comprise inorganic metal-chalcogenide nanotubes of the formula $A_{(1-x)}$-$B_x$-chalcogenide, wherein A is either a metal/transition metal or an alloy of such metals/transition metals, B is a metal or transition metal, and x being smaller or equal to 0.3 provided that A≠B.

The metal A may be a metal or transition metal or an alloy of metals or transition metals selected from the following: Mo, W, Re, Ti, Zr, Hf, Nb, Ta, Pt, Ru, Rh, In, Ga, and alloys like WMo, TiW, $W_zMo_{1-z}$. In other embodiments, the metal A is selected from any metal or any metal alloy that forms metal-chalcogenide nanotubes.

In some embodiments, metal B is selected from the following: Si, Nb, Ta, W, Mo, Sc, Y, La, Hf, Jr, Mn, Ru, Re, Os, V, Au, Rh, Pd, Cr, Co, Fe, Ni, and alloys like $W_zMo_{1-z}$.

Within the nanotube, B and/or B-chalcogenide are incorporated within the A-chalcogenide. In some embodiments, the chalcogenide is selected from S, Se, Te. For example, a nanotube of the invention may be $Mo_{1-x}Nb_xS_2$, $Mo(W)_{1-x}Re_xS_2$, or can comprise or consist of alloys of $WMoS_2$, $WMoSe_2$, $TiWS_2$, $TiWSe_2$, where Nb or Re are doped therein. Within the alloys of the invention, taking WMo, TiW for example, the ratio between W and Mo or Ti and W may be 0.65-0.75 of one metal or transition metal and 0.25-0.35 of the other metal or transition metal, e.g. $W_{0.7}Mo_{0.29}Nb_{0.01}S_2$ (given with the percentage of the Nb dopant). In other embodiments, the metal B is selected from any metal that can be used as dopant in metal-chalcogenide nanotubes.

By incorporated it is meant that the B and/or B-chalcogenide are doped or alloyed uniformly within the A-chalcogenide lattice. The B and/or B-chalcogenide substitute the A atom within the lattice. Such substitution may be continuous or alternate substitutions.

In one embodiment, the concentration of the dopant ranges between 0.1% and 40% of the total metal content of the nanotube. In one embodiment, in the $A_{(1-x)}$-$B_x$-chalcogenide formula, x is less than 0.01. In one embodiment, x is less than 0.005. In one embodiment, x is between 0.005 and 0.01.

In one embodiment, the dopant is between 0.0001% and 10% of the total metal content of the nanotube. In one embodiment, the chalcogenide is selected from S, Se, and Te. In one embodiment, the nanotube comprises or is consisting of a material selected from the following: $Mo_{1-x}Nb_xS_2$, $Mo_{1-x}Nb_xSe_2$, $W_{1-x}Ta_xS_2$, $W_yTa_xSe_2$, $Mo_xW_yNb_{1-x-y}S_2$, $Mo_xW_yNb_{1-x-y}Se_2$, $Re_{1-x}W_xS_2$, $Ti_{1-x}Sc_xS_2$, $Zr_{1-x}Y_xS_2$, $Hf_{1-x}La_xS_2$, $Ta_{1-x}Hf_xS_2$, $Pt_{1-x}Ir_xS_2$, $Ru_{1-x}Mn_xS_2$, $Rh_{1-x}Ru_xS_2$, $Mo_{1-x}Re_xS_2$, $W_{1-x}Re_xS_2$, $Re_{1-x}Os_xS_2$, $Ti_{1-x}V_xS_2$, $Zr_{1-x}Nb_xS_2$, $Hf_{1-x}Ta_xS_2$, $Ta_{1-x}W_xS_2$, $Pt_{1-x}Au_xS_2$, $Ru_{1-x}Rh_xS_2$, $Rh_{1-x}Pd_xS_2$ wherein 0.0001<x<0.5 and 0.0001<y<0.5 or wherein 0.0001<x<0.9999 and 0.0001<y<0.9999, or wherein 0.0001<x<0.5 or wherein 0.0001<x<0.9999 or wherein 0.0001<x<1.9999 or wherein 0.0001<x<1.9999 and 0.0001<y<1.9999.

A mixture of chalcogenides in one compound is also an embodiment of this invention as described herein above. According to this aspect and in one embodiment, the nanotube comprises or consists of $WS_{2-x}Se_x$, $Mo_{1-x}W_xS_{2-y}Se_y$, $WS_{2-x-y}Se_xTe_y$, etc.

In one embodiment, the metal chalcogenide nanotubes of this invention comprise misfit compounds. In one embodiment, the metal chalcogenide nanotube comprises or consists of $Bi_2Se_3$.

Electromechanical device is a device wherein electrical energy is converted to mechanical energy or vice versa. For example, in an electromechanical device, motion is generated in response to electrical stimulation.

In embodiments of this invention, a pedal is a piece of material that is attached to the nanotube and is used to detect the mechanical properties (e.g. motion/rotation/bending/oscillations) of the nanotube in response to electrical stimulation. In embodiments of the invention the pedal modifies, enables, balances, augments, reduces, transfers, absorbs, exhibit, sense, detect, and/or control the mechanical actions performed by the nanotube in devices of this invention.

In one embodiment, the nanotube does not comprise carbon nanotubes. In one embodiment, the nanotube does not comprise carbon. In one embodiment, devices of this invention do not comprise carbon nanotubes.

Critical point drying (CPD) is a method that involves drying a sample without suffering the destructive effects of surface tension of solvents, by rinsing with a supercritical liquid $CO_2$, which smoothly goes from liquid to gas without a liquid-gas interface.

In one embodiment, the nanotubes in devices of this invention do not comprise carbon nanotubes. In one embodiment, the nanotubes in devices of this invention do not comprise carbon.

Resonators of the Invention

In one embodiment, this invention provides an electromechanical resonator comprising at least one metal-chalcogenide nanotube. In one embodiment, the device comprises one nanotube. In one embodiment, the device comprises more than one nanotube. In one embodiment, this invention provides a system or an apparatus comprising one or more devices/resonators of this invention. According to this aspect and in one embodiment, systems and apparatuses of this invention comprise one nanotube in one embodiment, or more than one nanotube in other embodiments. In one embodiment, systems and apparatuses of this invention further comprise probes, monitors, controllers, measurement devices, computerized elements, electrical contacts, optical instruments, current/voltage generators, shock absorbers, electrical components, optical components, and other elements that enable/facilitate the operation and function of the electromechanical devices, systems and apparatuses of this invention. In one embodiment, the device is a microelectromechanical (MEM) device, nanoelectromechanical (NEM) device or a combination thereof.

In one embodiment, the metal chalcogenide nanotube comprises $WS_2$, $MoS_2$, $WSe_2$, $MoSe_2$. In one embodiment, the metal chalcogenide nanotube comprises $Mo_{1-x}Nb_xS_2$, $Mo_{1-x}Nb_xSe_2$, $W_{1-x}Ta_xS_2$, $W_{1-x}Ta_xSe_2$, $Mo_xW_yNb_{1-x-y}S_2$, $Mo_xW_yNb_{1-x-y}Se_2$, $Re_{1-x}W_xS_2$, $Ti_{1-x}Sc_xS_2$, $Zr_{1-x}Y_xS_2$, $Hf_{1-x}La_xS_2$, $Ta_{1-x}Hf_xS_2$, $Pt_{1-x}Ir_xS_2$, $Ru_{1-x}Mn_xS_2$, $Rh_{1-x}Ru_xS_2$, $MO_{1-x}Re_xS_2$, $W_{1-x}Re_xS_2$, $Re_{1-x}Os_xS_2$, $Ti_{1-x}V_xS_2$, $Zr_{1-x}Nb_xS_2$, $Hf_{1-x}Ta_xS_2$, $Ta_{1-x}W_xS_2$, $Pt_{1-x}Au_xS_2$, $Ru_{1-x}Rh_xS_2$, $Rh_{1-x}Pd_xS_2$, $WS_{2-x}Se_x$, $Mo_{1-x}W_xS_{2-y}Se_y$, $WS_{2-x-y}Se_xTe_y$. In one embodiment, the nanotube is doped by another material. In one embodiment, the nanotube is doped by a metal. In one embodiment, the metal is Nb or Re. In one embodiment, the doping material comprises hydrogen, oxygen, fluorine or sodium.

In one embodiment, the electromechanical device of this invention is selected from the group consisting of: resonators, gyroscope, accelerometer, mass sensor, magnetometer, moving mirror.

In one embodiment, the diameter of the nanotube ranges between 1 nm and 1000 nm. In one embodiment, the diameter of the nanotube ranges between 1 nm and 100 nm. In one embodiment, the diameter of the nanotube ranges between 1 nm and 10 nm or between 10 nm and 50 nm or between 50 nm and 250 nm or between 250 nm and 500 nm or between 500 nm and 1μm.

In one embodiment, for a single nanotube, the nanotube is single-walled or multi-walled nanotube. In one embodiment, for more than one nanotube, the nanotubes are single-walled, multi-walled or a combination thereof. In one embodiment, the nanotube is at least partially hollow. In one embodiment, the nanotube is not hollow.

In one embodiment, devices/resonators of this invention further comprising:

a substrate;
at least a first pad and a second pad;
electrical contacts.

In one embodiment, a first region of the nanotube is in contact with the first pad and a second region of the nanotube is in contact with the second pad. In one embodiment, each of the first pad and the second pad is in contact with the substrate. In one embodiment, the substrate is coated. In one embodiment, the substrate comprises Si and the coating comprise $SiO_2$. In one embodiment, the substrate is doped Si. In one embodiment, the substrate is electrically conducting. In one embodiment, the coating on the substrate is electrically insulating.

In one embodiment, at least a portion of said nanotube is suspended over a surface. In one embodiment, the suspended portion of the nanotube is located between the two pads. In one embodiment, the suspended portion of the nanotube bridges between the two pads and is suspended over a surface of the substrate (or over the coated substrate). In one embodiment, the electrical contacts are connected to the pads. In one embodiment, at least one electrical contact is connected to each pad. In one embodiment, the electrical contacts connect the pads to an electrical instrument, to a measurement instrument, to an instrument that applies current/voltage to the pad(s) or a combination thereof. In one embodiment, the substrate is a material with low electrical resistance. In one embodiment, electrical contact(s) is/are connected to the substrate. In one embodiment, the electrical contact(s) that are connected to the substrate, connect the substrate to an electrical instrument, to a measurement instrument, to an instrument that applies current/voltage to the substrate or a combination thereof.

In one embodiment, the device further comprises a pedal. In one embodiment, the pedal is in contact with the nanotube. In one embodiment, the pedal is of a rectangular shape and is attached to the nanotube such that the longer dimension of the rectangle is positioned perpendicular to the longer dimension of the nanotube. In one embodiment, the rectangular pad is positioned asymmetrically with respect to the nanotube. In one embodiment, the nanotube is suspended over the substrate. In one embodiment, the device further comprises or connected to electronic instrument(s). In one embodiment, the instrument(s) comprise network analyzer, oscilloscope, lock-in amplifier, spectrum analyzer, RF signal generator, power supply, AC power generator, DC power generator, signal generator, pulse generator, function generator, waveform generator, digital pattern generator, frequency generator or a combination thereof. In one embodiment, voltage applied to the device generates mechanical response in the nanotube.

In one embodiment, the device further comprises electronic components.

In one embodiment, the pads and the substrate are connected by the electrical contacts to the network analyzer (or to any other instrument(s) from the list provided herein above), and the network analyzer (or any other instrument(s) from the list provided herein above), applies voltage between the pads and between the substrate, utilizing the electrical contacts.

In one embodiment, the applied voltage generates mechanical response in said nanotube. In one embodiment, the applied voltage comprises DC voltage and AC voltage. In one embodiment, the Q factor of the device ranges between 1 and 1000000. In one embodiment, the Q factor of the device ranges between 1 and 100. In one embodiment, the Q factor of the device ranges between 100 and 1000. In one embodiment, the Q factor of the device ranges between 1000 and 1000000. In one embodiment, the Q factor of the device ranges between 1 and 5.

In one embodiment, the device/resonator further comprising an electrode fabricated on the substrate. According to this aspect and in one embodiment, voltage is applied to the device by connecting the pads to one pole of the voltage generator, and connecting the electrode on the substrate to another pole of the voltage generator. According to this aspect and in one embodiment, instead of connecting the substrate underneath an insulating coating to the voltage generator, the electrode is connected to the voltage generator. In one embodiment, such connection allows to generate voltage between the electrode and the pads such that the nanotube will exhibit a mechanical response. According to this aspect and in one embodiment, the electrode is connected to the voltage generator (or to any other voltage source as described herein) through electrical contact(s).

Methods of Fabrication

In one embodiment, this invention provides a method of fabrication of an electromechanical device, the method comprising:
providing a substrate;
applying at least a first pad and a second pad onto said substrate such that said pads are not in contact with each other;
applying at least one metal-chalcogenide nanotube onto said pads such that a first region of said nanotube is in contact with said first pad and a second region of said nanotube is in contact with said second pad;
removing a substrate surface layer underneath said nanotube, thus suspending said nanotube over said substrate.

In one embodiment, the substrate comprises Si coated by $SiO_2$. In one embodiment, removing a substrate surface layer comprises removing a layer of the coating of the substrate. In one embodiment, removing a substrate surface layer means removing a layer of the $SiO_2$ coating of the substrate. According to this aspect and in one embodiment, the coated substrate is referred to as the "substrate". According to this aspect, the coating is a portion of the substrate. In other embodiments, the coating layer on the substrate is referred to as the coating or the coating layer and it does not include the substrate.

In one embodiment, the pads comprise chromium layer coated by gold layer. In one embodiment, the step of applying the pads comprises photolithography and metal deposition. In one embodiment, the step of applying at least one metal-chalcogenide nanotube, comprises dry dispersion of said nanotube. In one embodiment, the step of removing a substrate surface layer underneath the nanotube comprises etching the substrate layer using hydrofluoric acid (HF). In one embodiment, etching is followed by critical point drying (CPD). Other etching techniques and other etching materials can be used for etching substrates of this invention. Longer or shorter etching times can be used to control the etching profile/etching depth of the substrate/coated substrate of this invention. Other etching parameters such as etching material, etching temperature and etchant solution concentration can be modified to control the etching process. Such modifications are known to the skilled artisan.

In one embodiment, the method further comprises fabricating an electrode on the substrate. The electrode can be fabricated using lithography in one embodiment. Any other known fabrication technique can be utilized to fabricate an electrode on the substrate. The electrode can be fabricated before or after the fabrication of the pads. The electrode can be fabricated before or after application of the nanotube onto the pads in some embodiments. More than one electrode can be fabricated on the substrate as needed in embodiments of this invention.

Methods of Operation

In one embodiment, this invention provides a method of operating an electrochemical device/resonator, the method comprising:
providing a device comprising:
at least one metal chalcogenide nanotube;
a substrate;
optionally an electrode fabricated on said substrate;
at least a first pad and a second pad assembled on said substrate;
electrical contacts connected to said first and second pads, optionally to said substrate and/or optionally to said electrode;
wherein a first region of said metal-chalcogenide nanotube is in contact with said first pad and a second region of said nanotube is in contact with said second pad, and wherein a third region of said nanotube is suspended over said substrate;
applying voltage between said pads and said substrate or between said pads and said electrode, such that said voltage generates mechanical response of said metal chalcogenide nanotube.

In one embodiment, the resonator is activated by DC voltage. In one embodiment, the resonator is activated by AC voltage. In one embodiment, the resonator is activated by a combination of DC and AC voltages. In one embodiment, the resonator is activated by an RF signal generator. In one embodiment, the resonator is activated by a function generator. In one embodiment, the activation of the resonator is conducted using one or more of the following instruments: a network analyzer, oscilloscope, lock-in amplifier, spectrum analyzer, RF signal generator, AC power generator, DC power generator, signal generator, pulse generator, power supply, function generator, waveform generator, digital pattern generator, frequency generator or a combination thereof. In one embodiment, voltage applied to the device is applied using any one or more of the instruments described herein above.

In one embodiment, the mechanical response of the device is detected. In one embodiment, the mechanical response of the device is detected optically. In one embodiment, the mechanical response of the device is detected electrically. In one embodiment, the mechanical response of the device comprises resonance at a certain frequency or at certain frequencies. In one embodiment, the resonance frequency of the device is detected as noted herein above. In one embodiment, the resonance behavior of the device is used to generate a signal.

In one embodiment, the mechanical response of the device is detected electrically, by measuring the electrical response of the inorganic nanotube to mechanical deformation as noted above.

In one embodiment, optical detection of the mechanical response is performed by laser doppler vibrometer, laser interferometer, optical microscope, or other methods as known in the art. In some embodiments, electrical detection is performed using a lock in amplifier, network analyzer, spectrum analyzer, and/or using any generic electrical circuit. Some electrical instruments described herein above for applying voltage to the resonator can be used to detect the mechanical response of the nanotube in embodiments of this invention.

In one embodiment, the mechanical response of the device is detected electrically, by measuring the electrical response of the inorganic nanotube to mechanical deformation as noted herein above.

In one embodiment detecting the mechanical response is performed by measuring changes in the conductance of the nanotube upon deformation.

In one embodiment detecting the mechanical response is performed by measuring changes in the capacitance of the resonator upon deformation. (capacitance between the nanotube and the substrate, or between the nanotube and the electrode, changes as the nanotube moves).

In one embodiment, the substrate is coated. In one embodiment, the coated substrate comprises silicon and said coating comprises silicon oxide.

In one embodiment, the region of the nanotube that is suspended over the substrate is located between the first pad and the second pad. In one embodiment, at least one region of the nanotube that is suspended over the substrate is located between the first pad and the second pad.

In one embodiment, the mechanical response comprises torsion, in-plane rotation, in-plane bending, out of phase bending or a combination thereof.

In one embodiment, the electromechanical device is used as a gyroscope for navigation of miniaturized unmanned aerial vehicles (UAVs), as a chemical sensor, or as a biological sensor. In one embodiment, the device further comprises a pedal, the pedal is in contact with the suspended nanotube, such that the pedal is suspended over said substrate. Figure 1d shows an embodiment of a device wherein the pedal and the nanotube are suspended over the substrate.

In one embodiment, the pedal is of a rectangular shape and is attached to said nanotube such that the longer dimension of said rectangle is positioned substantially perpendicular to the longer dimension of said nanotube. In one embodiment, the rectangular pad is positioned symmetrically with respect to said nanotube. In one embodiment, the rectangular pad is positioned asymmetrically with respect to said nanotube. In one embodiment, symmetrically and asymmetrically refers to the orientation of the pedal with respect to the longer dimension of the nanotube. For example, in a symmetric orientation, the portion of the pedal on one side of the nanotube is of the same shape and size as the portion of the pedal on the other side of the nanotube. In some embodiments, in an asymmetric orientation, the portion of the pedal on one side of the nanotube is smaller or larger than the portion of the pedal on the other side of the nanotube. In some embodiments, such asymmetry results in certain electromechanical properties which are different from the electromechanical properties of a device wherein the pedal is symmetrically oriented with respect to the nanotube.

In one embodiment, perpendicular or substantially perpendicular orientation of the longer dimension of the pedal with respect to the longer dimension of the nanotube means at an angle of 90 degrees or at any angle between 85 and 95, between 80 and 100, or between 70 and 110 degrees with respect to the longer dimension of the nanotube. Other angular orientations of the pedal with respect to the nanotube are used in embodiments of this invention. In some embodiments, the pedal has non-rectangular shape. Other pedal shapes and other pedal orientations with respect to the nanotubes are possible in embodiments of this invention. For example, round or circular pedals, tear drop, wire, oval, or completely non-symmetric pedal geometries are used in embodiments of this invention. For each pedal shape used, any non-symmetric orientation with respect to the long dimension of the nanotube is included in embodiments of this invention. In embodiments of this invention, the size of the pedal portion present on one side of the nanotube is different from the size of the pedal portion present on the other side of the pedal. Pedal size can also be modified and fitted to various applications of devices of this invention.

In one embodiment, applying voltage comprising applying AC voltage, or a combination of AC and DC voltages. In one embodiment, the frequency of the AC voltage is in the RF range.

In one embodiment, the method of operating the device further comprising detecting the mechanical response of the nanotube. In one embodiment, the response is detected optically. In one embodiment, the response is detected electrically. In one embodiment, electrical detection comprises a conductivity measurement. In one embodiment, electrical detection comprises a capacitance measurement.

In one embodiment, devices of this invention comprise electromechanical resonators. In one embodiment, devices of this invention are electromechanical resonators. In one embodiment, resonators of this invention are devices. In one embodiment, the devices are electromechanical devices. In one embodiment, resonators of this invention comprise electromechanical devices. In one embodiment, description of a resonator refers to description of a device.

The terms RF, AC and DC are the electronics terms known in the art.

In one embodiment, a portion of a nanotube is suspended over the substrate. In one embodiment, a nanotube suspended over a substrate means that a portion of the nanotube is suspended over the substrate while at least two anchor portions of the nanotube are attached to pads (each portion to a separate pad) such that the suspended portion of the nanotube is located between the two portions of the nanotube that are attached to the pads.

In one embodiment, a resonance frequency of resonators of this invention ranges between 15 and 24 MHz. In one embodiment, a resonance frequency of resonators of this invention ranges between 10 and 30 MHz. In one embodiment, a resonance frequency of resonators of this invention ranges between 7 and 30 MHz or between 7 and 50 MHz. In one embodiment, the resonance frequency is a torsional resonance frequency. In one embodiment, the resonance frequency is in the MHz range. In one embodiment, the resonance frequency is in the KHz range.

In one embodiment, voltage is applied to the resonator in order to activate the resonator. In one embodiment, an RF generator is used to apply voltage to the resonator. In one embodiment, an AC power generator is used to apply voltage to the device/resonator. In one embodiment, the frequency of the AC voltage applied is in the RF (radio frequency) range. In one embodiment, the frequency of the voltage applied is in the MHz range.

In embodiments of this invention, self-sensing means that activating the device and detecting the response of the device is done using the same or similar technique, or by the same apparatus, or according to the same or similar principles, or by using the same or similar physical property/parameter.

In one embodiment, the term "a" or "one" or "an" refers to at least one. In one embodiment the phrase "two or more" may be of any denomination, which will suit a particular purpose. In one embodiment, "about" or "approximately" or "substantially" may comprise a deviance from the indicated term of +1%, or in some embodiments, −1%, or in some embodiments, ±2.5%, or in some embodiments, ±5%, or in some embodiments, ±7.5%, or in some embodiments, ±10%, or in some embodiments, ±15%, or in some embodiments, ±20%, or in some embodiments, ±25%.

EXAMPLES

Example 1

Resonance Spectra of Nanotubes

Figure 2A:
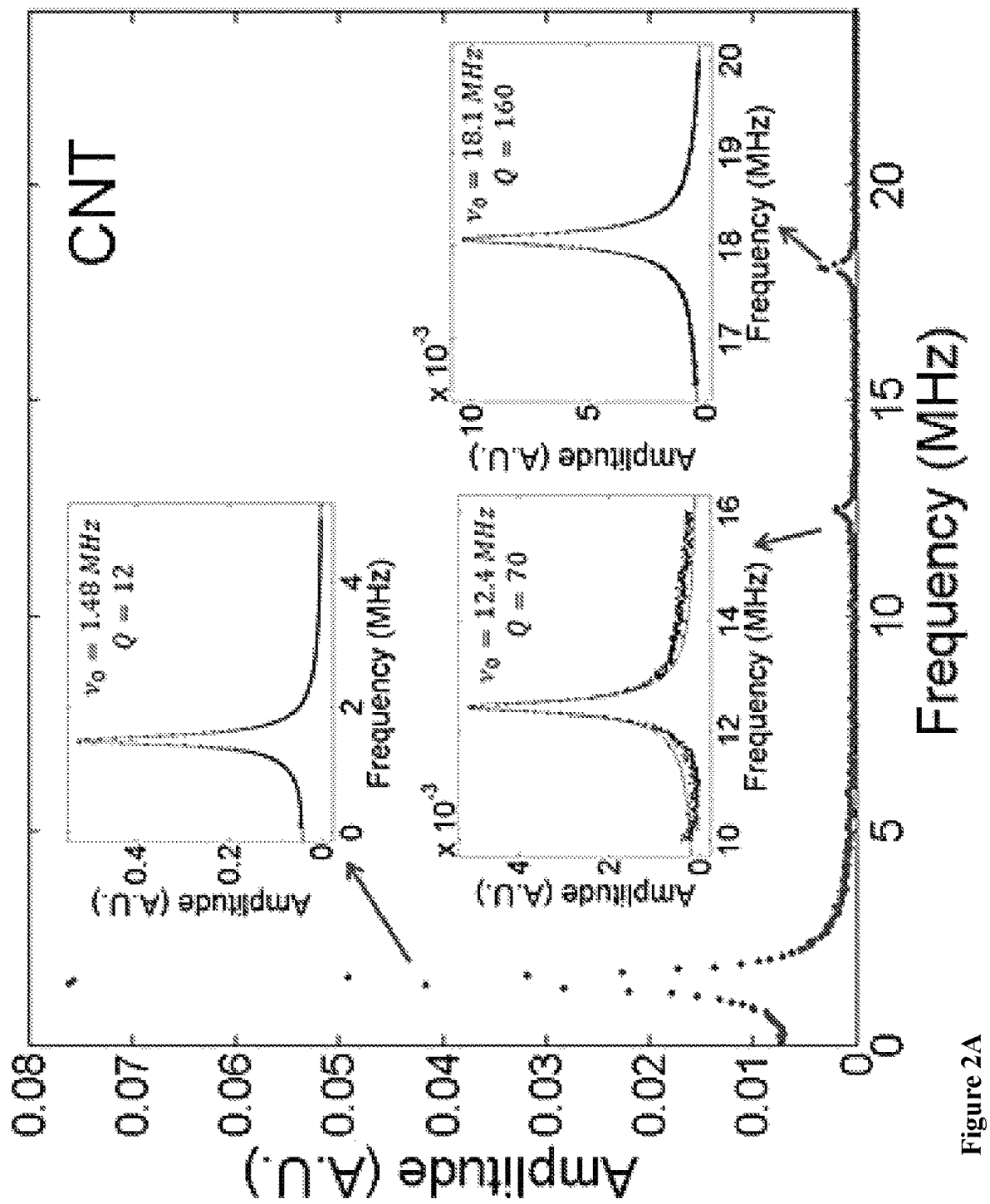
FIG. 2 shows representative resonance spectra of the different nanotube-based torsional resonators: (a) CNT (device #2); (b) BNNT (device #5); and (c) $WS_2$ NT (device #1). Insets show the fittings to Equation 1 of the various resonance peaks, measured at a higher resolution. In (b), there is one distinct peak at 5.84 MHz, and smaller features at higher frequencies that appeared regardless of the location of the LDV laser spot, and are hence most likely an artifact of the measurement due to the relatively low signal-to-noise ratio for some of the measurements (see relative amplitude signal scales).
Figure 2B:
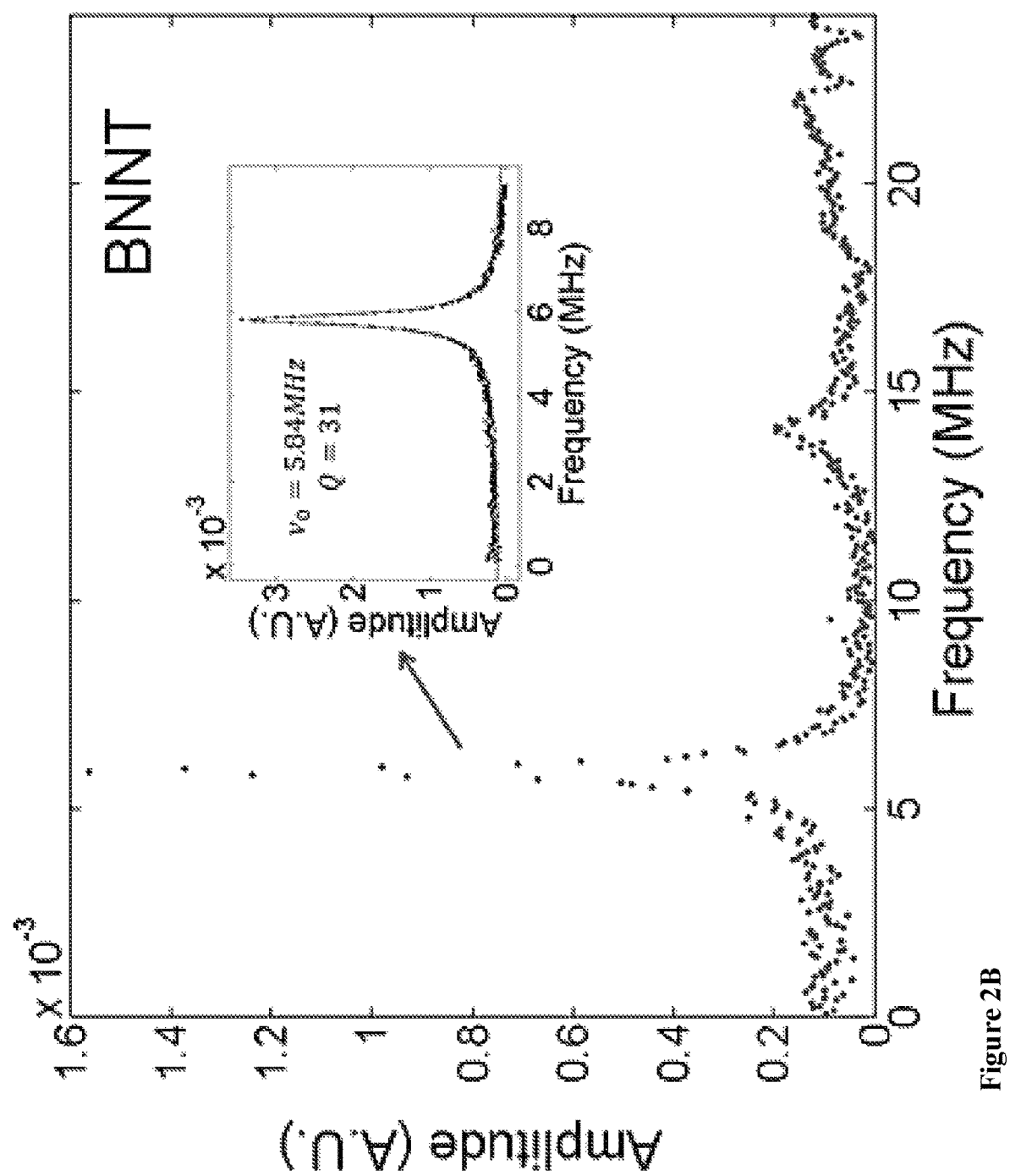
Figure 2C:
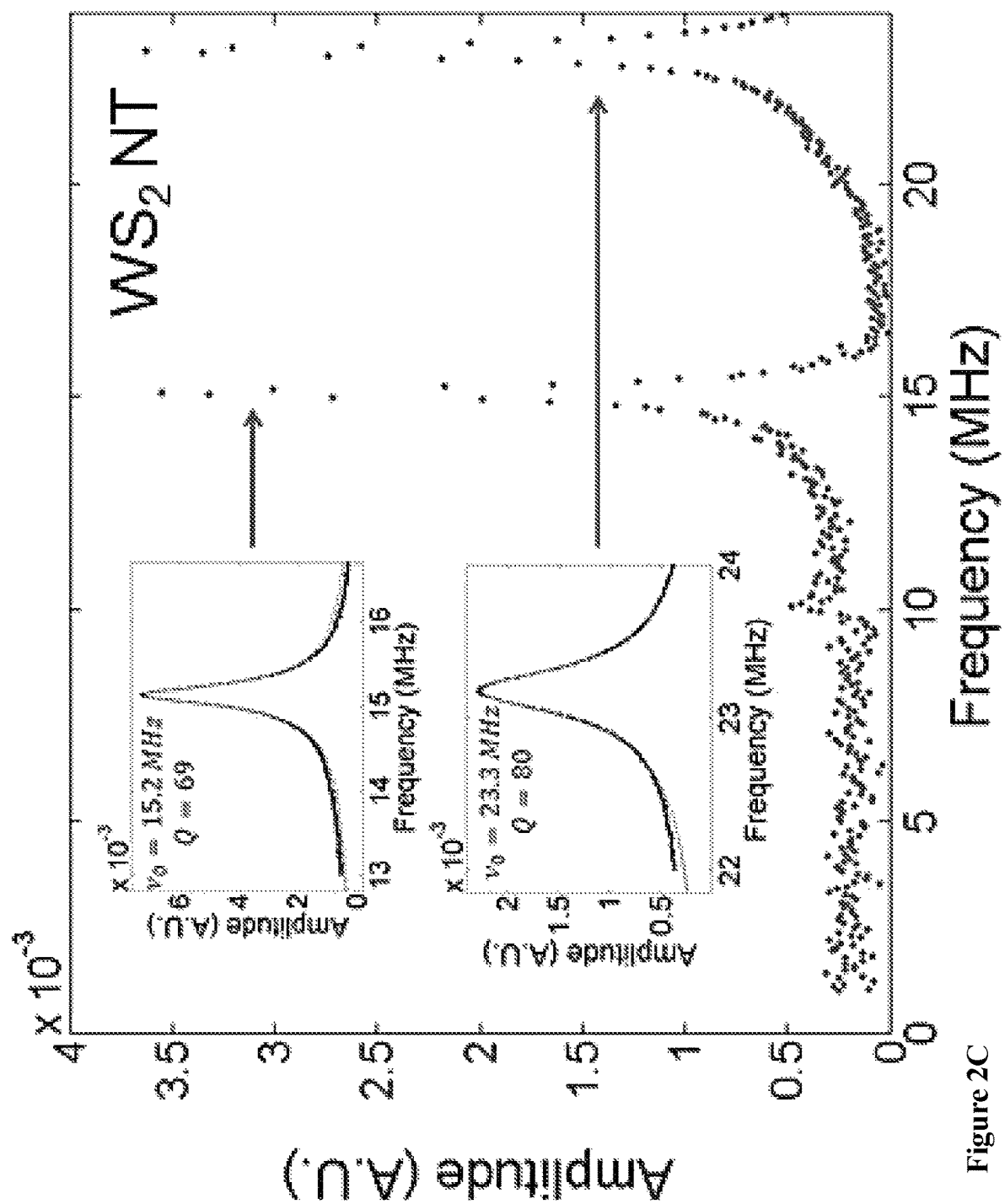

FIG. 2 shows representative resonance spectra of CNT-, BNNT- and $WS_2$ NT-based torsional resonators under atmospheric pressure. The resonance frequency and quality factor were extracted for each peak in the spectrum by fitting the results to a classical driven damped oscillator, Equation 1, where $\theta_{max}$ is the amplitude of the pedal, $\kappa$ is the torsional spring constant, $\tau_0$ is the maximal electrostatic torque on the pedal, $v$ is the driving frequency, $v_0$ is the natural resonance frequency $$\left(v_0 = \frac{1}{2\pi}\sqrt{\frac{\kappa}{I}},\right)$$

where I is the pedal mass moment of inertia, and Q is the quality factor. Results for all the CNT-, BNNT- and $WS_2$ NT-based resonators are summarized in Tables 3, 4 and 5 respectively. A total of 25 devices were measured: 11 of CNTs, 9 of BNNTs and 5 of $WS_2$ NTs. While CNT-based resonators exhibited 2-5 peaks in the measured frequency range, $WS_2$ NTs exhibited 1-2 peaks, and BNNTs displayed only one distinct peak.

$$\theta_{max}(v) = \frac{\tau_0 v_0^2/\kappa}{\sqrt{(v^2 - v_0^2)^2 + \frac{v_0^2}{Q^2}v^2}} \quad (1)$$

EXAMPLE 2

Finite Element Analysis

In order to assign the different peaks to their corresponding oscillation mode, and in particular, to identify the torsional mode, a finite element analysis (FEA) using COMSOL MULTIPHYSICS™ has been conducted. The numerical convergence of our FEA simulations was verified through refining of the mesh. A variety of simulations comprising the wide range of parameters that can exist in these systems have been performed, namely: (i) NT diameters between 5.8 and 88.4 nm; (ii) Young's modulus between 170 GPa (for $WS_2$ NTs) and 0.8-1.2 TPa (for CNTs and BNNTs); (iii) Poisson's ratios between 0 and 0.3; (iv) densities between 1380 kg/m³ (for BNNTs) and 7730 kg/m³ (bulk density of $WS_2$); and (v) extents of intershell coupling ranging from the extreme case of a hollow cylinder (only the outermost shell carrying the load) to the other extreme case of a solid rod (all the shells coupled). In all these simulations, the lowest-frequency natural (eigen) mode was always the torsion, followed by significantly higher frequencies related to the other modes (in-plane rotation, in-plane bending and out-of-plane bending). Following this detailed analysis, the first peak (i.e. lowest-frequency) of all our measured spectra can be safely assigned to the torsional mode of the nanotube-based resonators. FIG. 3 shows an example for such an analysis for the resonator whose resonance spectrum is depicted in FIG. 2a. Comparing the FEA simulations to the experiments, it can be seen that the torsional mode is consistent with a hollow cylinder case, while the in-plane and out-of-plane bending modes are consistent with a solid rod case. This result is consistent with the torsional behavior of MWCNTs, which is known to involve only the outer shell of the nanotube, and the intuitive assumption that the bending motion will have to involve all the shells. Discrepancies between measured peak positions and calculated resonance frequencies can be explained by the simplicity of the model, which does not take into account the complexity of the inner structure of the nanotubes and its anisotropy, as well as defects and imperfections appearing during the fabrication process. Also, the normal mode designated as "torsion" does in fact contain a small component of bending motion, and likewise, the normal mode designated as "out-of-plane" in fact contains a small component of torsional motion, each mode having a different contribution from all the walls (solid rod case) or only from the outer wall (hollow cylinder case). In principle, the experimental setup is not designed to actuate nor detect in-plane motion, so these modes are ideally not expected to appear in the spectra. Nonetheless, due to misalignment of the resonator with respect to the laser beam, and the offset of the pedal with respect to the nanotube, x-y-z cross-talk and parasitic actuation is expected to a certain degree. This could explain the appearance of the in-plane bending mode and the absence of the in-plane rotation mode in the spectrum.

FEA simulations of BNNT- and $WS_2$ NT-based torsional resonators are qualitatively similar to those of CNTs (FIG. 3), and are summarized in FIGS. 7 and 8, respectively. Comparing the measured resonance frequency of BNNT-based resonators to the simulation suggests that the resonant torsional motion of BNNTs is an intermediate case between the solid rod and hollow cylinder cases, i.e. there is some degree of intershell coupling during the torsional motion. The FEA simulation for $WS_2$ NT-based resonators seemingly points out to a discrepancy: the measured torsional resonance frequency appears to be higher than the extreme case of solid rod, as if the number of shells twisting together was larger than the number of existing shells in the nanotube. This discrepancy can be related to the fact that the Young's modulus used for the simulation was the most widely accepted value (170 GPa), but $WS_2$ NTs are known to exhibit a large variance in their Young's modulus (between ~15 GPa and ~615 GPa).

Example 3

Comparison of Torsional Resonance Spectrum

Figure 4A:
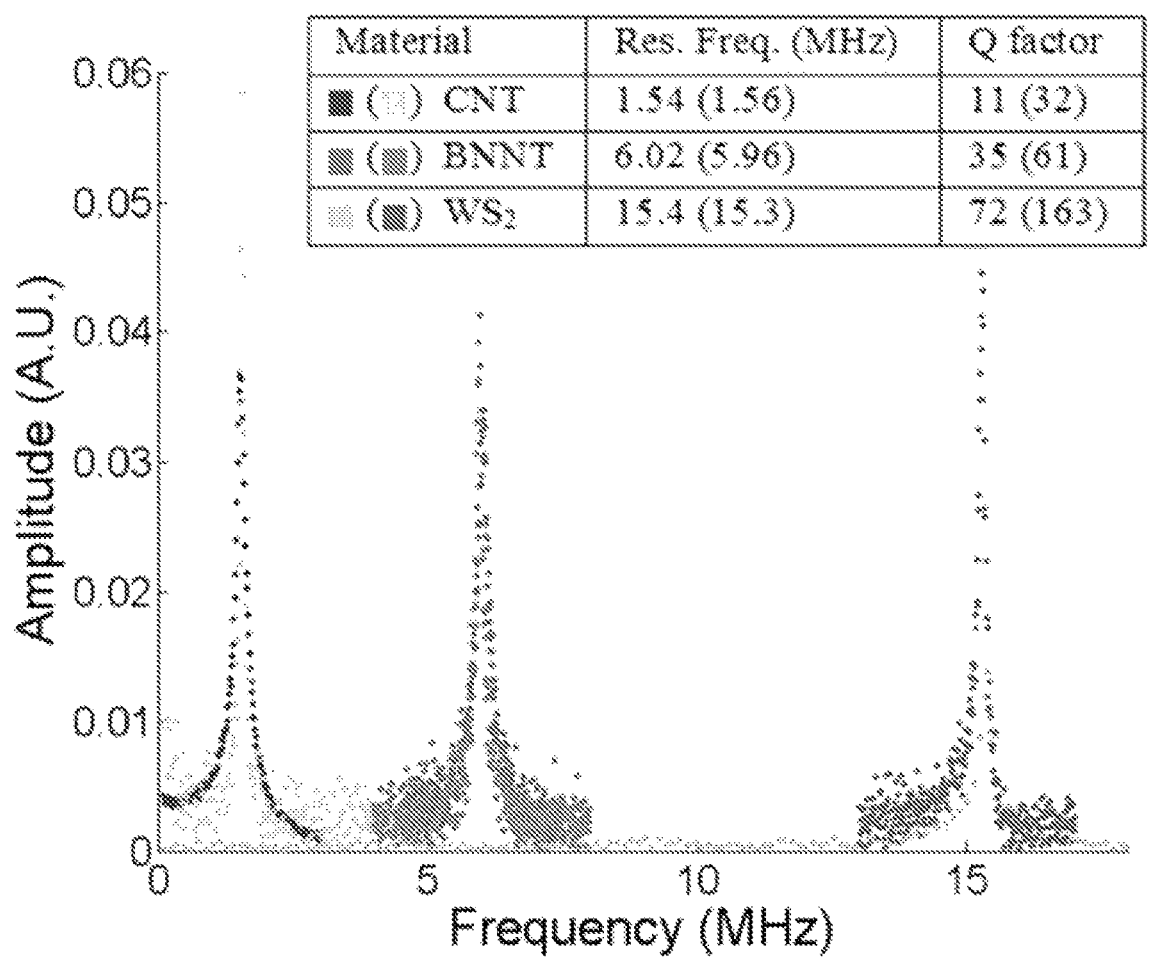
FIG. 4 is a comparison of torsional resonance characteristics of CNTs, BNNTs and $WS_2$ NTs: (a) Torsional resonance peaks of representative CNT-, BNNT- and $WS_2$-NT-based resonators in air and vacuum (CNT device #2 (left), BNNT device #1 (middle) and $WS_2$ NT #1 (right), respectively). Values in parenthesis represent the values measured in vacuum. (b) Dynamic torsional spring constant of the torsional resonators measured in air as a function of NT diameter. (c) Quality factors of all resonators in air as a function of their torsional spring constant (in (b) and in (c), lower left CNT, middle BNNT, upper right WS2).
Figure 4B:
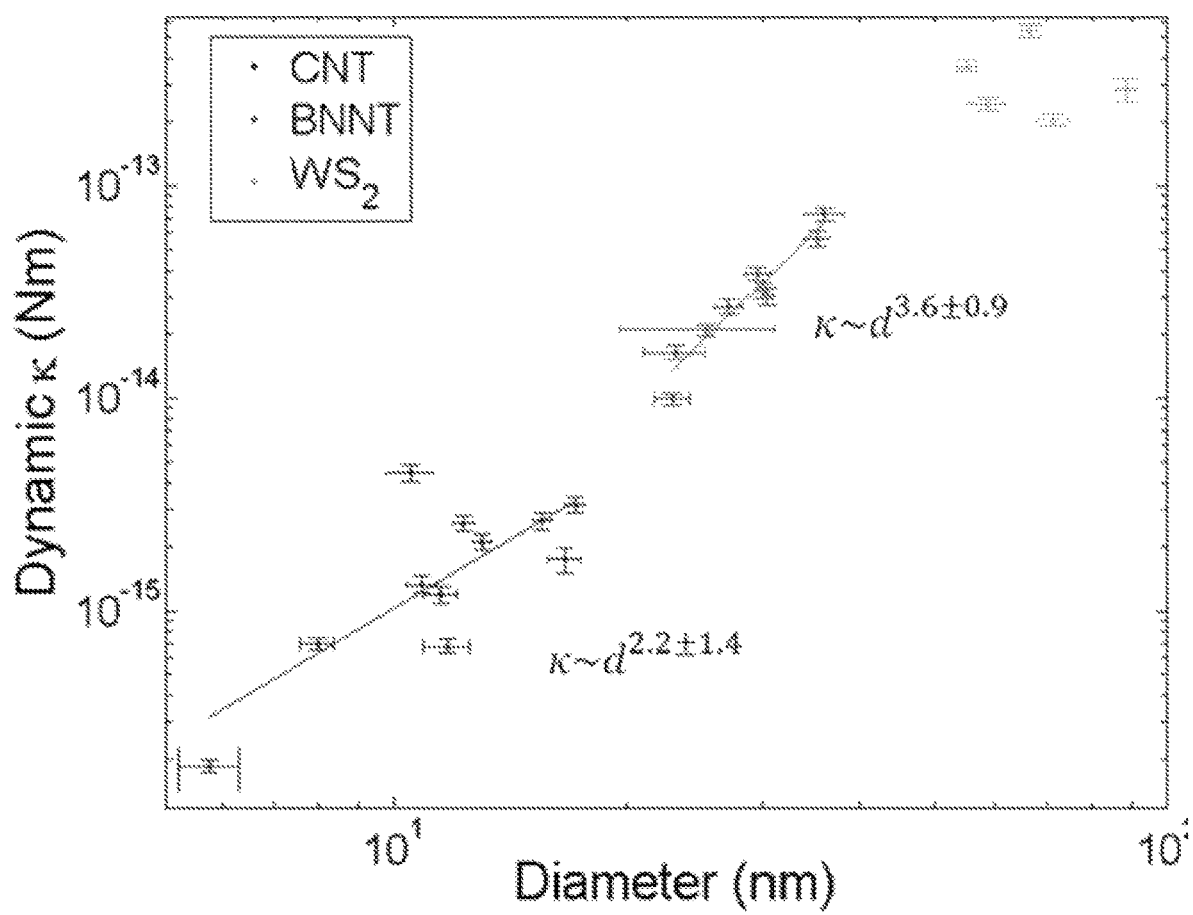

FIG. 4a shows a comparison of the torsional resonance spectrum for a typical torsional device from each material under atmospheric pressure and in vacuum (values in parenthesis represent the values measured in vacuum). Comparing the torsional resonance spectra of all the measured torsional resonators, $WS_2$ NTs exhibit the highest average torsional resonance frequency (19.7±4.1 MHz), followed by BNNTs (5.21±1.57 MHz) and CNTs (1.26±0.43 MHz). The same trend applies for the average quality factors as well: 86±30 for $WS_2$ NTs, 28±4 for BNNTs, and 15±9 for CNTs. Note that the numbers in the inset of FIG. 4a are results for certain devices and therefore differ from the average values noted herein above. Dynamic K, namely the torsional spring constants extracted from the resonance spectra measured in air using the relation: $v_0 = 1/2\pi\sqrt{I/\kappa}$, is plotted as a function of nanotube diameter d in FIG. 4b (for our devices, the effective κ takes into consideration the two segments of the suspended nanotube, which are simultaneously twisted in opposite directions). WS$_2$ NTs exhibit the highest dynamic κ, followed by BNNTs and CNTs. This trend is consistent with the expected strong dependence of κ on the diameter of the nanotube (—d$^4$ assuming a solid rod case, and ~d$^3$ assuming a hollow cylinder case). The power law of κ in the diameter can thus provide a measure of the intershell coupling: it should be closer to 4 if the shells are more coupled and closer to 3 if only the outermost shell carries the torsional load. It can be seen that the BNNTs exhibit a power law of ~d$^{3.6}$, which suggests a more significant intershell coupling than CNTs (~d$^{2.2}$). The power law of BNNTs is consistent with an intermediate case between the two extreme cases suggested by the FEA simulations. WS$_2$ NTs could not be fitted to any such power law, probably due to the high variance in the intershell coupling between the individual nanotubes constituting the resonators and the large variance in their Young's moduli mentioned earlier.

Figure 4C:
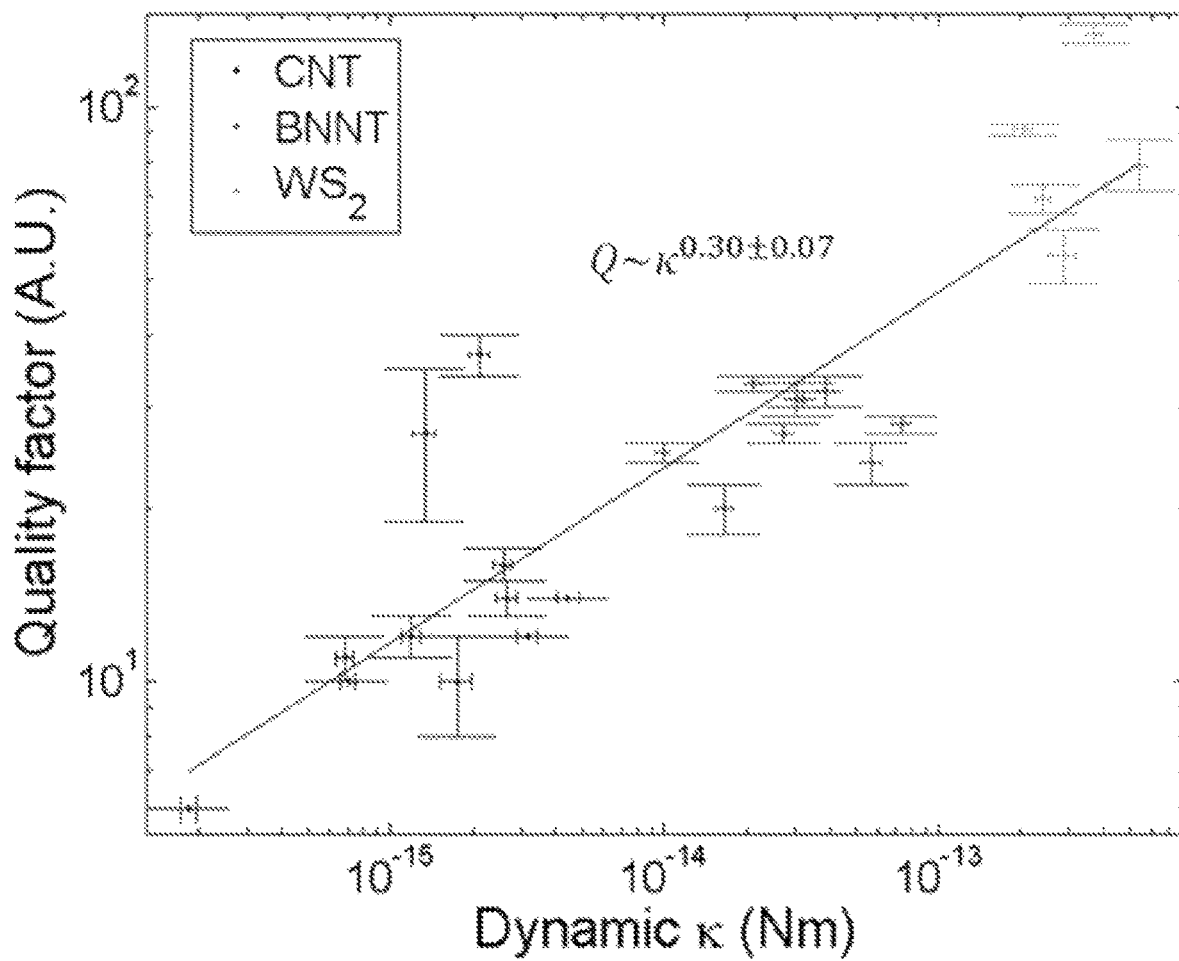

FIG. 4c shows that the measured quality factors under atmospheric pressure increase with the dynamical torsional spring constant. This relationship can be attributed to the dominant effect of air drag. When viscous losses (i.e. damping by the air) are the dominant energy dissipation mechanism, as in ambient conditions, then $Q=\sqrt{\kappa I}/b$, where κ is the dynamic torsional spring constant, I is the pedal mass moment of inertia, and b is the damping coefficient due to air friction. The mass moment of inertia depends mainly on the geometry and density of the pedal, since the nanotube material and diameter have a negligible influence, and thus I should be quite similar for all resonators (except for small differences in the offset of the pedal position with respect to the nanotube due to nanofabrication inaccuracies). A calculated squeeze number of 0.04 and 0.15 (see Example 9) for CNT- and BNNT-based resonators, respectively, indicates that for these resonators, the damping coefficient b of the system is expected to be mainly contributed by pure drag-force damping (drag caused by a moving object in a fluid far away from other surfaces), as opposed to squeeze-film damping (increased damping caused by squeezing of the gas confined between two nearby surfaces). A common approach to estimate pure drag-forces is to substitute the oscillating object by a superposition of spheres. The damping coefficient of each sphere is given by Equation 2, where μ is the air viscosity, r is the radius of the sphere, ρ is the air density, and ω is the oscillation frequency. Since at resonance $$\omega = \sqrt{\frac{\kappa}{I}\left(1-\frac{1}{2Q^2}\right)} \approx \sqrt{\frac{\kappa}{I}},$$

the expected damping coefficient of our system should be $b \sim \kappa^{0-0.25}$, and thus $Q \sim \kappa^{0.25-0.5}$ is expected. As seen in FIG. 4c, our result of $Q \sim \kappa^{0.30\pm0.07}$ is consistent with this prediction. Due to their higher resonance frequency, the squeeze number of torsional resonators based on WS$_2$ NT is higher (0.55), indicating a higher contribution of squeeze-film damping. The squeeze-film damping coefficient for torsional resonators at high frequencies is of the form of a converging series and thus does not have a simple power law dependence on the resonance frequency.

$$b_{air-drag}=3\pi\mu r+\frac{3}{4}\pi r^2(2\rho\mu\omega)^{1/2} \tag{2}$$

Example 4

Vacuum Measurements of Device Frequency Response

In order to observe the intrinsic behavior of the nanotube, i.e. the internal friction which is induced by the nanotube material and structure, the air damping has to be reduced down to the point where it is negligible compared to the internal friction of the NT. The air pressure range in which the intrinsic behavior is dominant can be referred to as the intrinsic region. Measurements of the torsional devices frequency response were thus conducted in vacuum and are summarized in Table 1. As expected due to reduction of the interaction of the pedal with the air molecules, the vacuum caused an increase in the quality factor of all nanotubes. Averaging the ratios of the quality factors in vacuum with respect to the quality factors in air, it appears that all the quality factors have changed approximately by the same factor (2.4±0.6 for CNT devices, 1.7±0.3 for BNNTs and 2.3±0.2 for WS$_2$ NTs). This suggests that, although the quality factor that was measured was closer to the intrinsic Q, the vacuum level that was reached did not completely eliminate air damping. If the intrinsic region would have been reached, it would have been expected to see the quality factor of each material change by a different factor under vacuum, since the intrinsic Q of each material should be independent of the Q in air. Nonetheless, the intrinsic component of the Q measured in vacuum was more significant when compared to the measurement in air.

TABLE 1

Comparison between torsional resonance frequencies and quality factors at atmospheric pressure and under vacuum.

| | device # | diameter (nm) | air res. freq. (MHz) | air Q factor | vacuum res. freq. (MHz) | vacuum Q factor | ratio between Q factors |
|---|---|---|---|---|---|---|---|
| CNT | 1 | 16.7± | 1.36 ± 0.01 | 13 ± 1 | 1.34 ± 0.01 | 37 ± 2 | 2.8 ± 0.3 |
| | 2 | 17.2± | 1.54 ± 0.01 | 11 ± 1 | 1.55 ± 0.01 | 30 ± 3 | 2.7 ± 0.4 |
| | 3 | 10.5± | 2.26 ± 0.01 | 18 ± 1 | 2.18 ± 0.01 | 30 ± 1 | 1.7 ± 0.1 |
| | 4 | 8.0 ± 0.4 | 0.97 ± 0.01 | 10 ± 1 | 0.99 ± 0.01 | 77 ± 8 | 7.7 ± 1.1 |
| BNNT | 1 | 30.4± | 6.02 ± 0.01 | 35 ± 1 | 5.96 ± 0.01 | 62 ± 4 | 1.8 ± 0.1 |
| | 2 | 23.2± | 3.25 ± 0.01 | 25 ± 1 | 3.26 ± 0.01 | 50 ± 3 | 2.0 ± 0.1 |
| | 3 | 35.3± | 6.23 ± 0.01 | 27 ± 1 | 6.11 ± 0.01 | 37 ± 1 | 1.3 ± 0.1 |
| | 4 | 25.4± | 4.80 ± 0.01 | 33 ± 2 | 4.80 ± 0.01 | 56 ± 1 | 1.9 ± 0.1 |
| WS$_2$ | 1 | 57.4± | 15.4 ± 0.1 | 72 ± 4 | 15.3 ± 0.1 | 163 ± 10 | 2.3 ± 0.2 |

By comparing the quality factor Q that was measured in air for MWCNT torsional devices with the Q that was measured in sufficient vacuum for similar devices as previously performed, it is possible to roughly estimate the expected intrinsic Q for BNNTs and WS$_2$ NTs (see Example 8). According to the rough estimates, the quality factors of BNNTs and WS$_2$ are quite similar (200 and 216 respectively), and both are larger than CNTs, which have an average quality factor of 98 in vacuum, according to previous measurements. While the change in the Q factors is apparent for all devices of all materials when comparing the behavior under atmospheric pressure and in vacuum, the resonance frequency remains the same within the range of error, despite the seemingly expected shift to higher frequency predicted by Equation 3. Because the change in Q is by a factor of ~2, the expected shift in frequency should be ~0.2%, which is within the margin of error of the measurement.

$$v_{res} = v_0 \sqrt{1 - \frac{1}{2Q^2}} \quad (3)$$

Figure 5A:
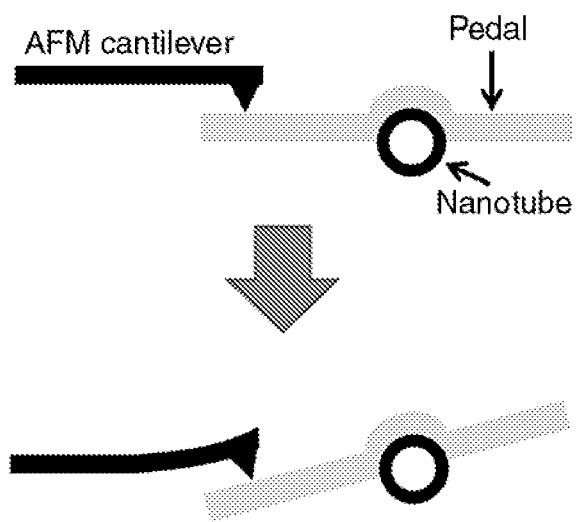
FIG. 5 is a measurement of the static torsional spring constant of CNTs, BNNTs and $WS_2$ NTs resonators. (a) Schematic of the AFM cantilever and the pedal during a force-distance measurement. (b) Linear stiffness of a CNT resonator (device #5) is plotted as a function of the position of the cantilever across the pedal.
Figure 5B:
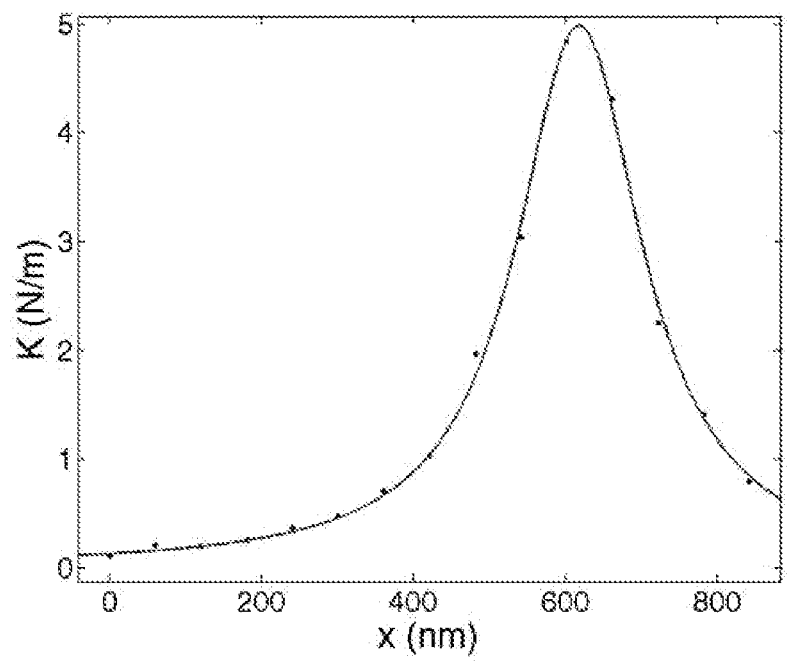

Following our calculation of the dynamic K, the static torsional spring constant (static κ) of the various nanotubes was also determined using the established method of pressing an atomic force microscope (AFM) tip against the pedal in various positions along the pedal, and measuring the force while twisting the nanotube (FIG. 5a). The linear stiffness K of the system was calculated for each position across the pedal. The static K was extracted by fitting the plot of K as a function of the tip position (FIG. 5b) to Equation 4, where x and α are the positions of the tip and the nanotube with respect to an arbitrary origin, respectively, κ is the static torsional spring constant and $K_B$ is the bending spring constant.

$$K = \left[ \frac{(x-a)^2}{2\kappa} + K_B^{-1} \right]^{-1} \quad (4)$$

In Table 2 the torsional spring constants that were extracted from the resonance spectrum measurements (dynamic κ, FIG. 4b) are compared to the static ones that were extracted from the AFM measurements. All measured devices exhibit a higher dynamic torsional spring constant than the static one. While for the CNT-based device the difference between the constants is within the range of error, for BNNT- and WS$_2$ NT- based devices this difference is significant.

The resonance spectrum measurements, from which the dynamic κ is extracted, involve twisting the nanotube at an average speed that is 6-7 orders of magnitude higher than in the static AFM-pressing measurement. It has been found during pullout experiments in double-wall carbon nanotubes (DWCNTs) that the intershell friction between the outer- and inner-shell increases linearly with increasing pullout velocity. Although the measured pullout velocities were axial rather than torsional, and they were significantly smaller than in the dynamic experiments presented herein, these findings are consistent with the present results, since the higher the intershell friction, the higher the coupling between shells should be, and thus more shells share the load and contribute to the overall torsion—i.e. the dynamic κ should be higher than the static one. The increased dynamic κ with respect to the static one does not seem to stem from squeeze-film effect, because, as seen in Table 1, there is no apparent difference between the resonance frequencies and thus dynamic torsional spring constants in air and in vacuum. The only comparison between static and dynamic κ of a CNT-based torsional device, based on a single MWCNT device measurement, had found the dynamic κ to be slightly smaller than the static one. The discrepancy between that and the present results is not yet understood.

BNNTs show an increase in the dynamic K with respect to the static one Similar to the CNT case, a velocity-dependent intershell friction mechanism might explain the higher dynamic κ. The fact that the dynamic/static ratio for BNNTs is higher than the dynamic/static ratio for CNTs could be explained by the different chemical composition and structure of the two types of nanotubes, and by the difference in diameters between the two types of nanotubes (since intershell friction is contact area dependent, the larger the diameter the larger the contact area). An additional factor leading to the higher dynamic κ should be considered for BNNTs and is related to their facets. It has been shown that BNNTs of large diameters (>27 nm) are faceted but undergo unfaceting when twisted using an AFM. It is possible that the time it takes for the BNNT to undergo unfaceting is longer than the time of oscillation, so the BNNT stays faceted through the whole oscillation. If this is indeed the case, the dynamic κ should be larger than the static one due to the intershell coupling of the faceted BNNT compared to the unfaceted one.

Compared to CNTs and BNNTs, WS$_2$ NTs exhibit the highest dynamic/static ratio. WS$_2$ NTs are known to exhibit torsional stick-slip behavior. This behavior, in which energy is dissipated due to irreversible jumps between neighboring equilibrium positions, is known to be responsible for velocity dependent friction on the atomic scale. As described earlier for CNTs, the high torsional velocity during dynamic

TABLE 2

Comparison between dynamic and static torsional behavior of CNTs, BNNTs and WS$_2$ NTs.

|  | device # | diameter (nm) | dynamic κ ($10^{-15}$ Nm) | static κ ($10^{-15}$ Nm) | dynamic κ/ static κ ratio |
| --- | --- | --- | --- | --- | --- |
| CNT | 5 | 12.3 ± 0.4 | 2.58 ± 0.21 | 2.03 ± 0.85 | 1.27 ± 0.54 |
| BNNT | 1 | 30.4 ± 0.5 | 38.7 ± 2.7 | 27.6 ± 3.4 | 1.40 ± 0.20 |
|  | 5 | 30.1 ± 0.5 | 30.4 ± 2.8 | 21.7 ± 1.7 | 1.40 ± 0.17 |
|  | 6 | 29.5 ± 1.2 | 32.2 ± 2.9 | 26.6 ± 3.2 | 1.21 ± 0.18 |
| WS$_2$ | 1 | 57.4 ± 3.3 | 204 ± 14 | 90 ± 4[a] | 2.26 ± 0.19 |
|  | 2 | 67.8 ± 3.5 | 242 ± 16 | 110 ± 27 | 2.21 ± 0.56 |

Note:
[a]The AFM force-distance measurement was conducted prior to the dynamic measurements, as opposed to the rest of the devices which were measured by AFM after the dynamic measurements.

measurements might cause increased intershell friction which may lead to higher coupling between shells. This means that more shells are involved in the torsional movement thus increasing κ. It has been suggested before that during the "stick regime" the different shells of the $WS_2$ NT are not necessarily locked or unlocked in an all-or-nothing situation. There is a possibility that the dynamic actuation causes the shells to have an increased degree of locking compared to the static AFM-pressing measurements. The high dynamic/static ratio might be explained by the difference in the mechanical and structural properties of $WS_2$ NTs with respect to CNTs and BNNTs. Although these are all different materials with different mechanical properties and dynamic behaviors, the difference in diameters also needs to be considered, since intershell friction is contact-area dependent. Further experiments with nanotubes of similar diameters could help in distinguishing between the effects of nanotube material and dimensions.

Example 5

Nanofabrication

Highly doped silicon wafers (Si<100>, P/B doped, resistivity of 0.005-0.02 Ω.cm) with 1000 nm oxide layer were cut to approximately 1 cm×1 cm. The cut silicon wafer was then cleaned by sonication in acetone, followed by sonication in IPA and blow drying by $N_2$. The clean silicon wafers underwent photolithography of pads (to serve later for wire bonding contacts) and alignment marks (to be used for electron-beam lithography later on), followed by electron beam evaporation of 20 nm Cr and 200 nm of Au and lift off in acetone. The nanotubes were later dispersed on the silicon wafer in the following manner:
   CNTs—MWCNTs synthesized by arc discharge and purchased from Iljin Nanotech.
   Co., Ltd were suspended in dichloroethane (DCE) and sonicated in order to separate bundles, and centrifuged. Several drops of the suspension were applied on the wafer and the sample was spun for several seconds.
   BNNTs—A few flakes of CVD-synthesized BNNTs were dissolved in DCE and sonicated. Several drops of the suspension were applied to the wafer and dried by air. The sample was then rinsed with acetone, IPA and blow dried by $N_2$.
   $WS_2$ NT's—grown by outside sulfurization (OS) were dispersed on the substrate by dry dispersion.
Nanotubes were mapped by SEM and their diameter was measured by AFM imaging. Pedal devices and electrodes were patterned on top of the selected nanotubes using electron beam lithography (EBL). In the case of CNTs, mild plasma ashing was carried out. To complete the patterning of the pedal devices and electrodes, evaporation of 5 nm Cr and 80 nm Au was carried out followed by acetone lift off. All torsional devices were then imaged by AFM in order to measure the dimensions of all the pedal devices. The wafer was glued by conductive epoxy glue to a chip-carrier and wire-bonding was carried out between the electrodes of the torsional devices and the chip-carrier. In order to make the NTs suspended and finalize the fabrication process HF (1:6 BOE) was used for 7 minutes in order to etch ~700 nm of the $SiO_2$ layer. The etching was followed by critical point drying (CPD) to allow drying while avoiding surface tension damages.

Example 6

Resonance Spectrum Measurement

Figure 6:
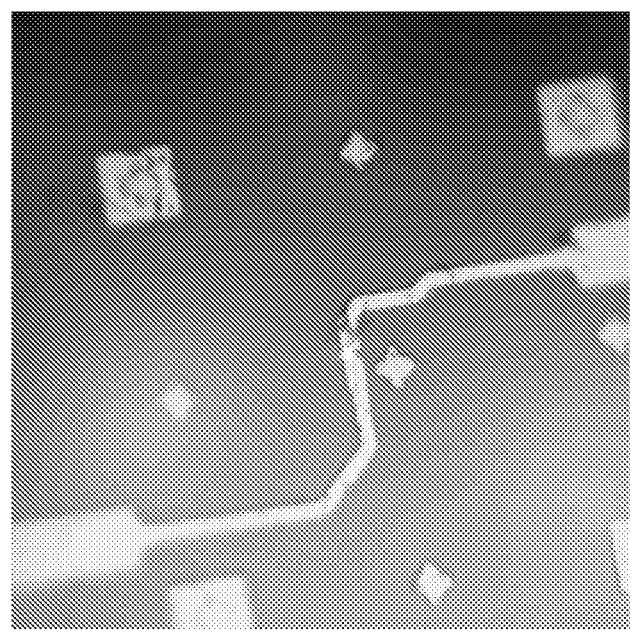
FIG. 6 shows aiming of the laser spot of the LDV system on the pedal.

A network analyzer (Keysight E5061B network analyzer) was connected to a torsional device fabricated using the methods described herein above. The electrostatic actuation signal generated by the network analyzer, which was comprised of a DC and an AC component, was connected to the highly doped silicon (the substrate) while the ground was connected to the two electrodes clamping the suspended nanotube and pedal. Detection of the displacement of the pedal was achieved by a laser Doppler vibrometer (Polytec LDV OFV5000 with a DD-300 displacement decoder) with a magnification lens of x100. The laser was aimed at the torsional device which was being actuated using a camera connected to the LDV, as seen in FIG. 6. The output of the LDV was fed back to the network analyzer, which in addition to actuation was also used to filter out only the relevant frequency, reduce noise, and display the results — a spectrum of pedal displacement as a function of driving frequency (the excitation frequency of the pedal). In a standard experiment a DC voltage of 2 V and an AC voltage of 1.4 V were applied (although in high driving frequencies the voltage reaching the device was lower due to attenuation from the cables used). A frequency sweep of the actuation voltage was carried out from 0.1 to 24 MHz (the upper limit of the LDV detection range) in order to get the full resonance spectrum. After measuring the full resonance spectrum high resolution measurements were made by narrowing the frequency sweep to include only one peak at a time in order to increase the accuracy of the measurement. In order to increase signal to noise ratio, averaging has been used — each frequency sweep was in fact an average of at least 30 measurements. The resonance frequency and quality factor were extracted by fitting each peak to Equation 1.

TABLE 3

Summary of CNT-based torsional devices resonance measurements. Peak number 1 for all devices is assigned to torsion, and the following peaks correspond to other vibration modes.

| device # | diameter (nm) | peak number | resonance frequency (MHz) | quality factor |
|---|---|---|---|---|
| 1 | 16.7 ± 0.8 | 1 | 1.26 ± 0.04 | 10 ± 2 |
|  |  | $2^a$ | 2.997 ± 0.001 | 23.4 ± 0.1 |
| 2 | 17.2 ± 0.5 | 1 | 1.48 ± 0.01 | 12 ± 1 |
|  |  | 2 | 12.43 ± 0.02 | 70 ± 2 |
|  |  | 3 | 18.08 ± 0.01 | 160 ± 1 |
| 3 | 10.5 ± 0.7 | $1^a$ | 2.024 ± 0.001 | 14.3 ± 0.2 |
|  |  | $2^a$ | 5.198 ± 0.003 | 23 ± 1 |
| 4 | 8.0 ± 0.4 | 1 | 0.97 ± 0.01 | 10 ± 1 |
|  |  | 2 | 4.22 ± 0.01 | 31 ± 1 |
|  |  | $3^a$ | 20.63 ± 0.01 | 170 ± 5 |
| 5 | 12.3 ± 0.4 | $1^a$ | 1.77 ± 0.01 | 16 ± 2 |
|  |  | 2 | 7.45 ± 0.03 | 57 ± 1 |
|  |  | 3 | 10.38 ± 0.02 | 43 ± 1 |
|  |  | $4^a$ | 11.39 ± 0.01 | 53 ± 5 |
| 6 | 15.6 ± 0.4 | 1 | 1.54 ± 0.01 | 14 ± 1 |
|  |  | 2 | 12.45 ± 0.04 | 80 ± 1 |
| 7 | 5.8 ± 0.5 | $1^a$ | 0.51 ± 0.01 | 5.5 ± 0.3 |
|  |  | $2^a$ | 2.69 ± 0.01 | 21 ± 1 |
|  |  | $3^a$ | 9.03 ± 0.02 | 26 ± 4 |
|  |  | $4^a$ | 21.46 ± 0.01 | 169 ± 13 |
| 8 | 11.7 ± 0.8 | 1 | 0.93 ± 0.01 | 11 ± 1 |
|  |  | 2 | 5.97 ± 0.04 | 52 ± 5 |
| 9 | 11.5 ± 0.6 | $1^a$ | 1.008 ± 0.003 | 12 ± 1 |
|  |  | $2^a$ | 5.48 ± 0.01 | 70 ± 22 |
|  |  | $3^a$ | 6.17 ± 0.02 | 37 ± 9 |
|  |  | $4^a$ | 7.04 ± 0.02 | 53 ± 14 |
|  |  | $5^a$ | $14.06^b$ | n/$a^b$ |

TABLE 3-continued

Summary of CNT-based torsional devices resonance measurements. Peak number 1 for all devices is assigned to torsion, and the following peaks correspond to other vibration modes.

| device # | diameter (nm) | peak number | resonance frequency (MHz) | quality factor |
|---|---|---|---|---|
| 10 | 13.0 ± 0.4 | 1[a] | 1.230 ± 0.002 | 37 ± 3 |
|  |  | 2[a] | 4.597 ± 0.009 | 41 ± 7 |
|  |  | 3 | 7.60[b] | n/a[b] |
| 11 | 10.9 ± 0.5 | 1 | 1.07 ± 0.02 | 27 ± 8 |
|  |  | 2 | 1.40 ± 0.01 | 57 ± 1 |
|  |  | 3[a] | 3.12 ± 0.01 | 33 ± 3 |
|  |  | 4 | 8.42 ± 0.02 | 105 ± 9 |
|  |  | 5 | 15.91[b] | n/a[b] |

Note:
Error ranges calculated from the variations between 3-5 measurements, each consisting of an average of 30-200 sweeps.
[a]Error range calculated from the fit to Equation 1 for one measurement consisting of an average of 30-200 sweeps.
[b]Quality factor indicated as "n/a" were not available because signal-to-noise was not enough to enable a reliable fit. In these cases, the error range for the resonance frequency is not available.

TABLE 4

Summary of BNNT-based torsional devices resonance measurements.

| device # | diameter | peak number | resonance frequency (MHz) | quality factor |
|---|---|---|---|---|
| 1 | 30.4 ± 0.5 | 1 | 5.84 ± 0.01 | 31 ± 2 |
| 2 | 23.2 ± 2.1 | 1 | 3.04 ± 0.04 | 20 ± 2 |
| 3 | 35.3 ± 1.4 | 1 | 5.85 ± 0.11 | 24 ± 2 |
| 4 | 25.4 ± 5.7 | 1 | 4.74 ± 0.01 | 33 ± 1 |
| 5 | 30.1 ± 0.5 | 1 | 5.84 ± 0.03 | 31 ± 1 |
| 6 | 29.5 ± 1.2 | 1 | 7.31 ± 0.02 | 32 ± 2 |
| 7 | 27.2 ± 1.1 | 1 | 3.89 ± 0.01 | 27 ± 1 |
| 8 | 22.9 ± 1.2 | 1[a] | 3.263 ± 0.002 | 25 ± 1 |
| 9 | 36.1 ± 2.2 | 1[a] | 7.130 ± 0.004 | 28 ± 1 |

Note:
[a]Error range calculated by standard deviation. For all other cases, the error range is calculated from the fit to Equation 1.

TABLE 5

Summary of WS$_2$ NT-based torsional devices resonance measurements.

| device # | diameter (nm) | peak number | resonance frequency (MHz) | quality factor |
|---|---|---|---|---|
| 1 | 57.4 ± 3.3 | 1 | 15.22 ± 0.12 | 69 ± 4 |
|  |  | 2 | 23.26 ± 0.11 | 80 ± 4 |
| 2 | 67.8 ± 3.5 | 1 | 15.87 ± 0.05 | 91 ± 2 |
|  |  | 2 | 25.15 ± 0.09 | 103 ± 1 |
| 3 | 89.0 ± 2.7 | 1 | 23.77 ± 0.11 | 55 ± 6 |
| 4 | 65.9 ± 1.5 | 1 | 23.52 ± 0.13 | 79 ± 8 |
| 5 | 55.2 ± 1.5 | 1 | 19.96 ± 0.05 | 134 ± 5 |

Example 7

Static Torsional Spring Constant Measurement

AFM imaging and static κ measurements were performed on Veeco Multimode/Nanoscope V with a closed-loop scanner. Measurement procedure is described in depth in Garel, J. et al. *Nano Lett.* 2012, 12, 6347-6352.

Example 8

Estimation of Intrinsic Q under Vacuum

First, the contribution of air damping to the total Q of CNT devices (Q viscous) was estimated by comparing Q in air (QCNT,air) from our measurements and Q in vacuum in the intrinsic region (Q intrinsic) measured by Papadakis et al. *Phys. Rev. Lett.* 2004, 93, 146101.

$$\frac{1}{Q_{CNT,air}} = \frac{1}{Q_{intrinsic}} + \frac{1}{Q_{viscous}} => \frac{1}{11} = \frac{1}{100} + \frac{1}{Q_{viscous}} => \frac{1}{Q_{viscous}} = 0.081$$

In order to roughly estimate the intrinsic Q of the nanotubes it was assumed that the friction coefficient and moment of inertia are the same for all materials. Using the following equation:

$$Q = \sqrt{\kappa I}/b$$

where κ is the dynamic torsional spring constant, I is the mass moment of inertia and b is the damping coefficient, $Q_{viscous}$, is scaled, (the Q due to viscous damping that was found earlier for CNTs), to find its equivalent for BNNTs and WS$_2$ NTs:

$$\frac{Q_{viscous,CNT}}{Q_{viscous,BNNT}} = \sqrt{\frac{\kappa_{CNT}}{\kappa_{BNNT}}} => Q_{viscous,BNNT} = 12.4 \cdot \sqrt{\frac{1.65 \cdot 10^{-14}}{3.17 \cdot 10^{-15}}} = 28.2$$

$$Q_{viscous,WS_2} = Q_{viscous,CNT}\sqrt{\frac{\kappa_{WS_2}}{\kappa_{CNT}}} = 12.4 \cdot \sqrt{\frac{2.42 \cdot 10^{-13}}{3.17 \cdot 10^{-15}}} = 108$$

These estimated values were used to estimate the intrinsic Q factor of BNNTs and WS$_2$:

$$\frac{1}{Q_{BNNT,air}} = \frac{1}{25} = \frac{1}{Q_{BNNT,intrinsic}} + \frac{1}{Q_{viscous,BNNT}} =$$

$$\frac{1}{Q_{BNNT,intrinsic}} + 0.035 => Q_{BNNT,intrinsic} = 200$$

$$\frac{1}{Q_{WS_2,air}} = \frac{1}{72} =$$

$$\frac{1}{Q_{WS_2,intrinsic}} + \frac{1}{Q_{viscous,WS_2}} = \frac{1}{Q_{WS_2,intrinsic}} + 0.009 => Q_{WS_2,intrinsic} = 216$$

Example 9

Calculation of Squeeze Number

The squeeze number is a dimensionless parameter indicating the significance of squeeze-film damping in the system, and defined as follows:

$$\sigma = \frac{12\mu\omega l^2}{Ph^2}$$

where μ is the dynamic viscosity, ω is the frequency, l is the length of the pedal, P is the pressure, and h is the gap size. Substituting all the parameters a value of ~0.04 is obtained for CNTs, 0.15 for BNNTs and ~0.55 for WS$_2$ NTs.

Example 10

Self-Sensing Torsional Resonator based on Metal Chalcogenide Nanotube

An electromechanical device was constructed. The device is based on an inorganic nanotube (e.g. WS$_2$), either single wall or multi-wall, that was placed on a substrate composed of a conducting material (e.g. doped Si wafer). The conducting material was coated by a highly insulating dielectric layer, such as silicon oxide. The nanotube was clamped at the ends by two metallic pads (source and drain) which are patterned on the insulating layer, and on top of the nanotube, a flat metallic plate (pedal) has been placed asymmetrically. The center part of the nanotube, including the pedal, is suspended above a trench that is etched in the insulating layer. The suspended part of nanotube, clamped by the pads, together with the pedal, constitute the resonator.

The pads were connected by a metallic pattern to an external circuit. The source pad is connected to an RF signal generator, and the drain is fed to a lock-in amplifier. The conducting layer of the substrate, which constitutes a gate electrode, was connected to another signal generator. The gate is applied with an RF signal ($\omega$), which is offset by some DC voltage that is higher than the amplitude of the signal. The source was applied with a signal at double the frequency and a small shift of an intermediate frequency ($2\omega$-$\Delta\omega$). Mechanical oscillation of the device at the resonant frequency leads to modulation of the conductivity due to either piezoresistivity or charge modulation on the nanotube. The resonator device acts as a signal mixer, and the detection of mechanical resonance is obtained by measuring a signal at an intermediate frequency ($\Delta\omega$) that is detected with lock-in techniques. The signal has distinct behavior when the device is at resonance.

The device was similarly actuated with an RF signal which is applied to the gate, and detected optically using a laser Doppler vibrometer. The two spectra, obtained by sweeping the frequency of actuation and measure manifestations (optical and electrical) of the mechanical resonances, were compared in order to characterize the device.

Figure 9:
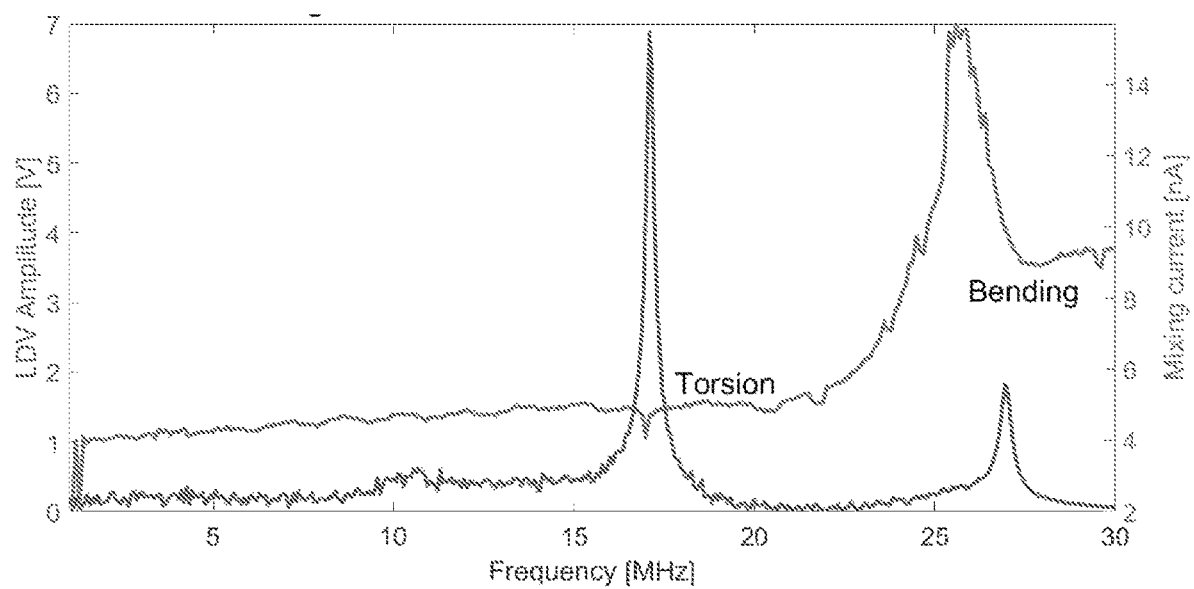
FIG. 9 LDV spectrum (lower) vs. mixing spectrum (upper) of tungsten disulfide nanotube-based torsional resonator.

FIG. 9 is a comparison of resonance spectra for a $WS_2$ nanotube based torsional device. The spectra were obtained with a laser Doppler vibrometer (lower line), and an electrical signal mixing measurement (upper line). There is a correlation between the resonance features obtained in each measurement. The peak at 17.2 MHz (obtained in both optical and electrical measurements), is postulated to belong to the torsion mode of the resonator. Another resonant feature at 27 MHz is possibly a bending mode, such as out-of-plane bending.

Figure 10:
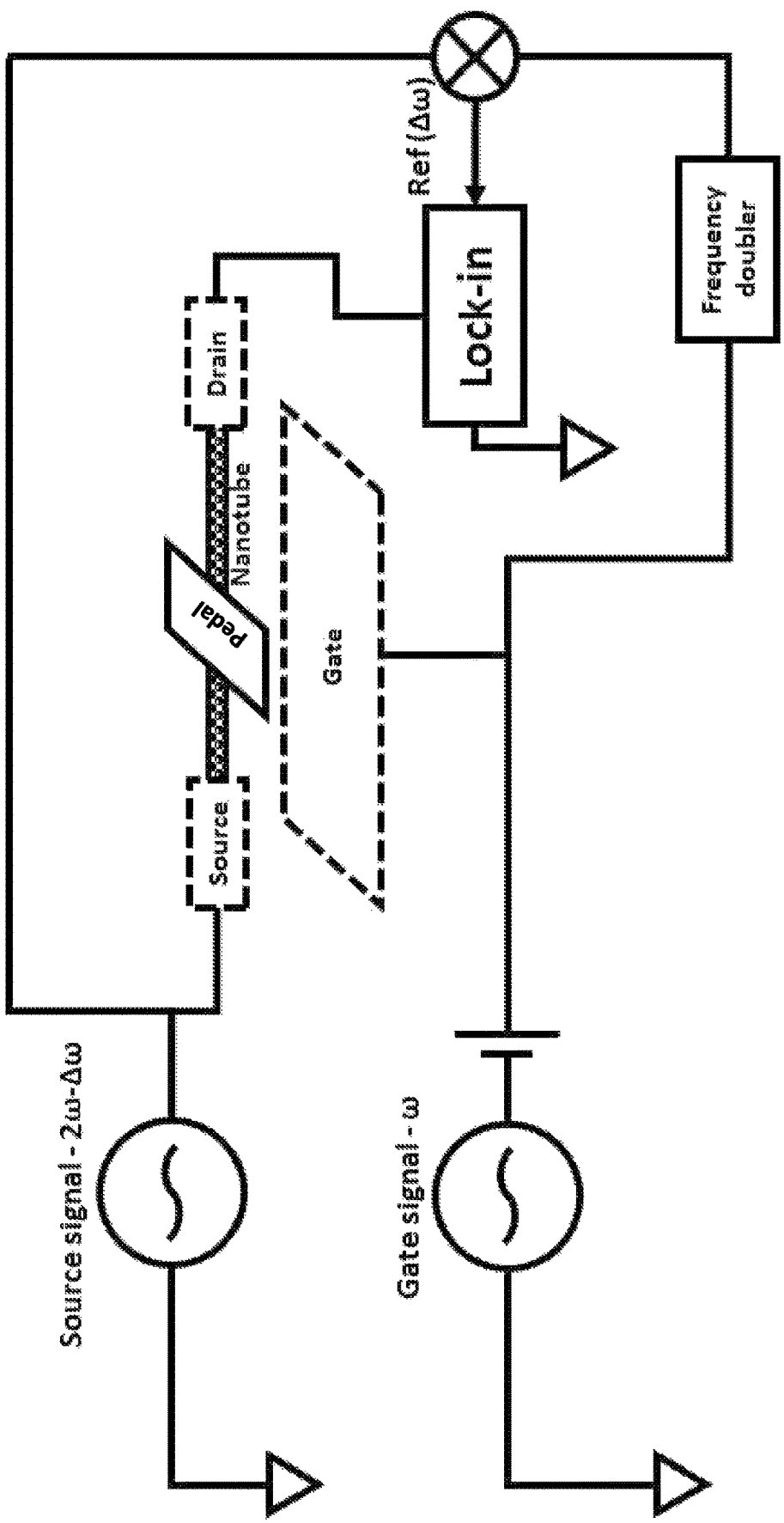
FIG. 10 is a schematic description of an electrical signal mixing measurement.

FIG. 10 is a schematic description of the electrical signal mixing measurement. Two RF sources are employed, supplying signal to the source and to the gate. A reference signal at the intermediate frequency is obtained by mixing the two signals. The drain current is measured with a lock-in amplifier.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method of fabrication of an electromechanical resonator, said method comprising:
providing a substrate;
applying at least a first pad and a second pad onto said substrate such that said pads are not in contact with each other;
applying at least one metal-chalcogenide nanotube onto said pads such that a first region of said nanotube is in contact with said first pad and a second region of said nanotube is in contact with said second pad;
applying a pedal on top of said nanotube, such that said pedal is in contact with said nanotube, wherein said pedal is of a rectangular shape and is attached to said nanotube such that the longer dimension of said rectangle is positioned perpendicular to the longer dimension of said nanotube; and wherein said rectangular pedal is positioned asymmetrically with respect to said nanotube; and
removing a substrate surface layer underneath said nanotube, thus suspending said nanotube over said substrate.

2. The method of claim 1, wherein said substrate comprises Si coated by $SiO_2$.

3. The method of claim 1, wherein said pads comprise chromium layer coated by gold layer.

4. The method of claim 1, wherein the step of applying said pads comprises photolithography and metal deposition.

5. The method of claim 1, wherein the step of applying at least one metal-chalcogenide nanotube, comprises dry dispersion of said nanotube.

6. The method of claim 1, wherein the step of removing a substrate surface layer underneath said nanotube comprises etching said substrate layer using hydrofluoric acid (HF).

7. The method of claim 6, wherein said etching is followed by critical point drying (CPD).

8. The method of claim 1, wherein following said step of removing a substrate surface layer, said pedal is suspended over said substrate.

9. The method of claim 1, further comprising fabricating at least one electrode on said substrate.

* * * * *